US010593574B2

(12) United States Patent
Fung et al.

(10) Patent No.: US 10,593,574 B2
(45) Date of Patent: Mar. 17, 2020

(54) TECHNIQUES FOR COMBINING CMP PROCESS TRACKING DATA WITH 3D PRINTED CMP CONSUMABLES

(71) Applicant: Applied Materials, Inc., Santa Clara, CA (US)

(72) Inventors: Jason G. Fung, Santa Clara, CA (US); Rajeev Bajaj, Fremont, CA (US); Daniel Redfield, Morgan Hill, CA (US); Aniruddh Khanna, San Jose, CA (US); Mario Cornejo, San Jose, CA (US); Gregory E. Menk, Pleasanton, CA (US); John Watkins, Los Gatos, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 615 days.

(21) Appl. No.: 14/935,134

(22) Filed: Nov. 6, 2015

(65) Prior Publication Data

US 2017/0133252 A1 May 11, 2017

(51) Int. Cl.
*B24B 37/013* (2012.01)
*H01L 21/67* (2006.01)
(Continued)

(52) U.S. Cl.
CPC ........ *H01L 21/67253* (2013.01); *B24B 37/26* (2013.01); *B24B 49/003* (2013.01);
(Continued)

(58) Field of Classification Search
CPC ..... H01L 21/304; H01L 21/306; H01L 21/67; B24B 37/205; B24B 37/013
(Continued)

(56) References Cited

U.S. PATENT DOCUMENTS 6,407,669 B1 6/2002 Brown et al.
7,530,880 B2 5/2009 Bajaj et al.
(Continued)

FOREIGN PATENT DOCUMENTS

WO 2009158665 A1 12/2009

OTHER PUBLICATIONS

International Search Report and Written Opinion for International Application No. PCT/US2016/057669 dated Nov. 3, 2016.
(Continued)

*Primary Examiner* — Robert A Rose
(74) *Attorney, Agent, or Firm* — Patterson + Sheridan LLP

(57) ABSTRACT

Chemical mechanical polishing (CMP) apparatus and methods for manufacturing CMP apparatus are provided herein. CMP apparatus may include polishing pads, polishing head retaining rings, and polishing head membranes, among others, and the CMP apparatus may be manufactured via additive manufacturing processes, such as three dimensional (3D) printing processes. The CMP apparatus may include wireless communication apparatus components integrated therein. Methods of manufacturing CMP apparatus include 3D printing wireless communication apparatus into a polishing pad and printing a polishing pad with a recess configured to receive a preformed wireless communication apparatus.

27 Claims, 8 Drawing Sheets

(51) Int. Cl.

| | | |
|---|---|---|
| *B29C 64/106* | (2017.01) | |
| *B33Y 10/00* | (2015.01) | |
| *B33Y 80/00* | (2015.01) | |
| *B24B 37/26* | (2012.01) | |
| *B24B 49/00* | (2012.01) | |
| *B24B 49/10* | (2006.01) | |
| *B24B 49/14* | (2006.01) | |
| *B24B 49/16* | (2006.01) | |
| *H01L 21/306* | (2006.01) | |
| *H01L 21/66* | (2006.01) | |
| *B29L 31/00* | (2006.01) | |

(52) U.S. Cl.
CPC .............. *B24B 49/10* (2013.01); *B24B 49/14* (2013.01); *B24B 49/16* (2013.01); *B29C 64/106* (2017.08); *B33Y 10/00* (2014.12); *B33Y 80/00* (2014.12); *H01L 21/30625* (2013.01); *H01L 21/67075* (2013.01); *H01L 21/67294* (2013.01); *H01L 22/20* (2013.01); *B29K 2995/0003* (2013.01); *B29K 2995/0005* (2013.01); *B29L 2031/736* (2013.01); *H01L 22/12* (2013.01); *H01L 22/26* (2013.01)

(58) Field of Classification Search
USPC ................................................ 451/5, 6, 8, 41
See application file for complete search history.

(56) References Cited

U.S. PATENT DOCUMENTS

| 7,815,778 | B2 | 10/2010 | Bajaj | |
|---|---|---|---|---|
| 7,840,305 | B2 | 11/2010 | Behr et al. | |
| 7,846,008 | B2 | 12/2010 | Bajaj | |
| 8,066,555 | B2 | 11/2011 | Bajaj | |
| 8,075,745 | B2 | 12/2011 | Bajaj | |
| 8,177,603 | B2 | 5/2012 | Bajaj | |
| 8,292,692 | B2 | 10/2012 | Bajaj | |
| 8,388,410 | B2* | 3/2013 | Albright, Jr. | B24B 37/16 451/269 |
| 8,676,537 | B2 | 3/2014 | Liu et al. | |
| 8,712,571 | B2 | 4/2014 | Liu et al. | |
| 9,162,340 | B2 | 10/2015 | Joseph et al. | |
| 2004/0106367 | A1* | 6/2004 | Walker | B24B 37/205 451/528 |
| 2006/0014475 | A1 | 1/2006 | Sekiya | |
| 2007/0149094 | A1 | 6/2007 | Choi | |
| 2008/0004743 | A1* | 1/2008 | Goers | B24B 49/02 700/121 |
| 2009/0318062 | A1 | 12/2009 | Chiu et al. | |
| 2011/0045744 | A1 | 2/2011 | Feng et al. | |
| 2011/0048772 | A1* | 3/2011 | Han | C09D 11/52 174/257 |
| 2011/0183583 | A1* | 7/2011 | Joseph | B24B 37/22 451/41 |
| 2012/0315830 | A1 | 12/2012 | Joseph et al. | |
| 2013/0283700 | A1* | 10/2013 | Bajaj | B24B 37/26 51/295 |
| 2015/0126099 | A1* | 5/2015 | Krishnan | B33Y 10/00 451/529 |
| 2016/0229023 | A1 | 8/2016 | Lugg et al. | |

OTHER PUBLICATIONS

TW Office Action dated Oct. 4, 2019 for Application No. TW105133977.
TW Search Report dated Oct. 21, 2016 for Application No. TW105133977.

* cited by examiner

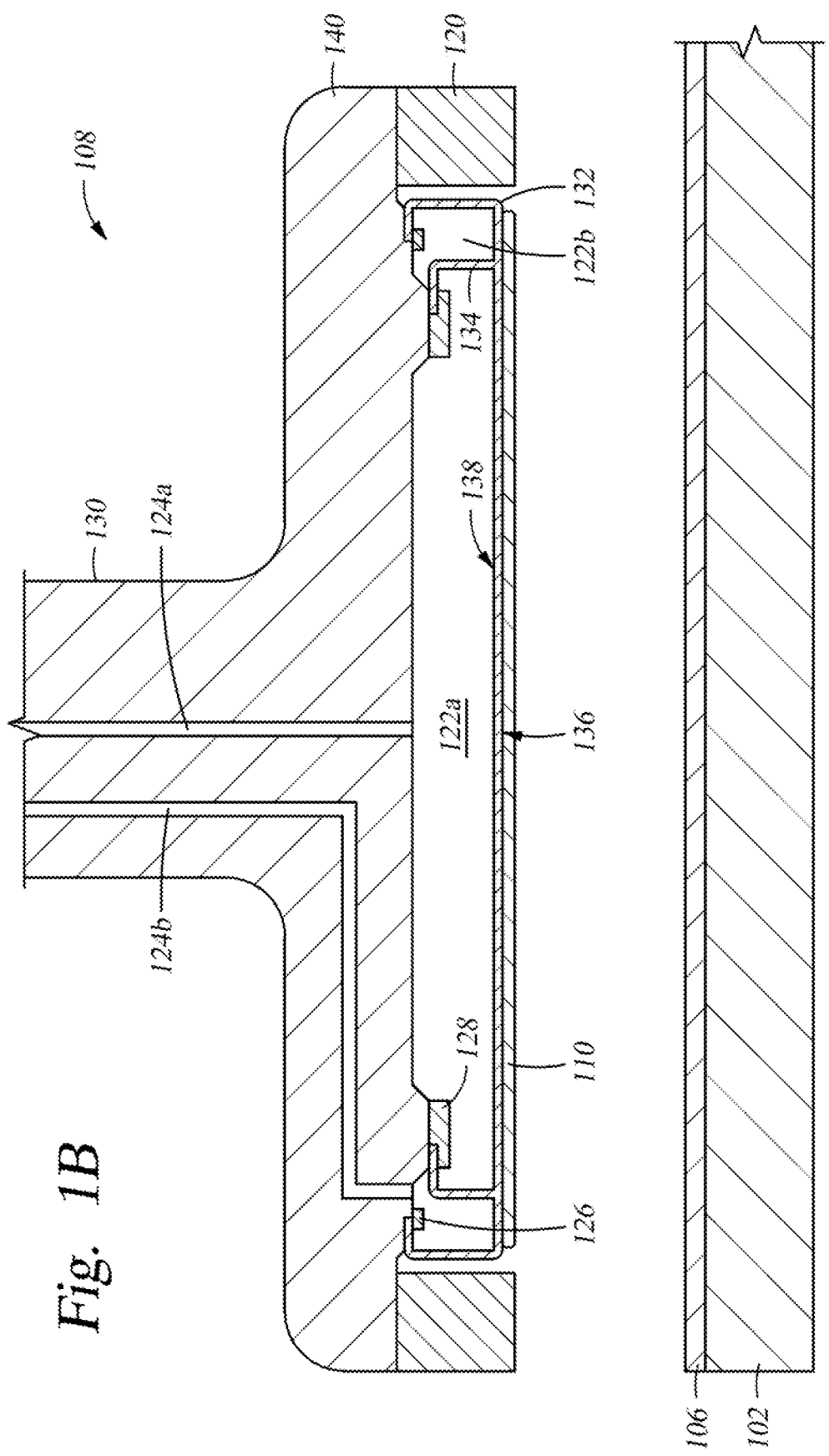

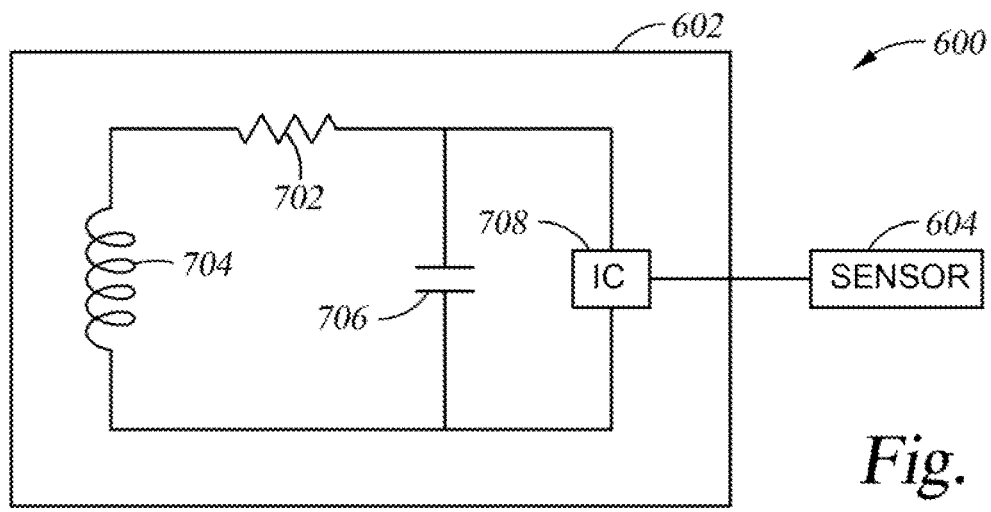
Fig. 7
Fig. 8
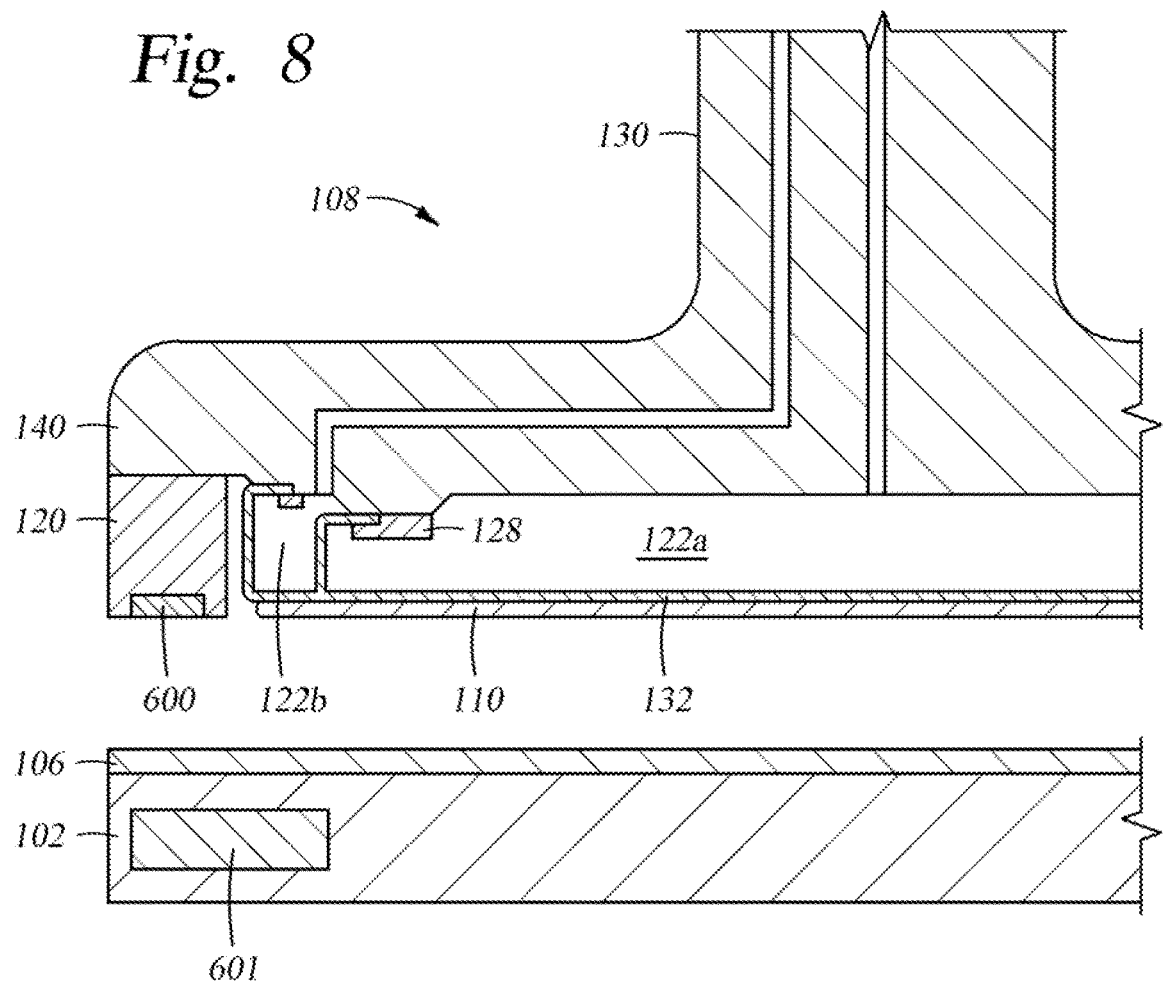

TECHNIQUES FOR COMBINING CMP PROCESS TRACKING DATA WITH 3D PRINTED CMP CONSUMABLES

BACKGROUND

Field

Embodiments of the present disclosure generally relate to a chemical mechanical polishing (CMP) apparatus and methods of making and using the same. More specifically, embodiments described herein relate to techniques for collecting data in a CMP apparatus, such as collecting data relating to a CMP process and/or data relating to a component found in the CMP polishing apparatus.

Description of the Related Art

Chemical mechanical polishing (CMP) is a technique commonly used to planarize substrates during the fabrication of semiconductor devices. During a CMP process, a substrate being processed is mounted on a carrier head with the device surface positioned against a rotating polishing pad. The carrier head provides a controllable load to the substrate to push the device surface against the polishing pad. A polishing liquid, such as a slurry with abrasive particles, is typically supplied to the surface of the polishing pad. Polishing pads are consumable components that typically become worn after polishing a certain number of substrates. Accordingly, the pads, and other CMP consumable components, need to be replaced occasionally to maintain a consistent and suitable polishing performance.

Polishing pads are typically made by molding, casting or sintering polyurethane materials. In the case of molding, the polishing pads can be made one at a time, e.g., by injection molding. In the case of casting, the liquid precursor is cast and cured into a cake, which is subsequently sliced into individual pad pieces. The pad pieces can then be machined to a final thickness. Grooves can be machined into the polishing surface, or be formed as part of the injection molding process. These methods of manufacturing polishing pads are expensive and time consuming. Moreover, polishing pads manufactured by these methods often yield non-uniform polishing results. For example, during CMP, different areas on the substrate may be polished at different rates resulting in too much material removed ("overpolishing") in some areas or too little material removed ("underpolishing") in other areas.

In addition, polishing pads and other CMP apparatus manufactured by conventional techniques often lack devices and methods for performing various tracking, sensing, monitoring, and process metrology functions. Conventional CMP systems often rely on system level sensing techniques which typically do not provide enough data to adequately control the CMP processes required to planarize devices formed in advanced technology integrated circuit nodes.

Therefore, there is a need for CMP systems, polishing pads and other CMP apparatus that provide improved polishing performance and desirable process sensing capabilities. In addition, there is a need for methods of manufacturing such apparatus.

SUMMARY

In one embodiment, a polishing pad apparatus is provided. The apparatus includes a 3D printed polymeric body comprising one or more polishing features having an upper surface configured to contact a substrate. The 3D printed polymeric body includes a first region that comprises a first material and a second region that comprises a second material. An RFID tag may be integrally disposed within the 3D printed polymeric body and the RFID tag may be positioned a distance from the upper surface.

In another embodiment, a chemical mechanical polishing system is provided. The system includes a platen having a supporting surface and a 3D printed polishing pad having an RFID tag disposed therein. The 3D printed polishing pad may be disposed over the supporting surface of the platen and an interrogator may also be coupled to the platen. The interrogator and the RFID tag are configured to communicate with one another using a wireless communication technique. A polishing head may also be positioned opposite the platen and the polishing head may be configured to urge a substrate against a polishing surface of the 3D printed polishing pad.

In yet another embodiment, a method of manufacturing a polishing pad is provided. The method includes depositing a 3D printed first portion of a polishing pad by distributing one or more first polymeric material from a first nozzle of a 3D print head. The one or more first polymeric material may be electrically non-conductive and a 3D printed RFID tag may be deposited by distributing one or more second polymeric materials from a second nozzle of a 3D print head on the 3D printed first portion of the polishing head. The one or more second polymeric materials may include at least one electrically conductive or semi-conductive polymeric materials. A 3D printed second portion of the polishing pad may be deposited over the 3D printed RFID tag and the 3D printed first portion by distributing the one or more first polymeric materials from the first nozzle of the 3D print head.

In yet another embodiment, a method of using a 3D printed polishing head is provided. The method includes sensing one or more processing parameters with an RFID tag disposed within a 3D printed polishing pad and receiving, via an interrogator, one or more signals from the RFID tag. The method also includes communicating the one or more signals to a controlled adapted to control the polishing process.

In yet another embodiment, a wireless communication method is provided. The method includes performing a substrate polishing process in a polishing system. The polishing system may include a platen, a polishing pad coupled to the platen, and a polishing head comprising one or more components removably coupled to the polishing head. An RFID tag may be coupled to the one or more components and one or more wireless communication signals may be received from the RFID via an interrogator fixably disposed in the platen. The one or more wireless communication signals may be analyze and the one or more components may be removed from the polishing head.

In yet another embodiment, a structure embodied in a machine readable medium used in a design process is provided. The structure includes a 3D printed polymeric body comprising one or more polishing features having an upper surface configured to contact a substrate. The 3D printed polymeric body includes one or more substantially non-electrically conductive first materials and a 3D printed RFID tag comprising one or more second materials may be integrally disposed within the 3D printed polymeric body. The one or more second materials may be conductive or semi-conductive.

In yet another embodiment, a non-transitory computer-readable medium is provided. The computer-readable medium may store instructions that, when executed by a processor, cause the computer system to implement a substrate polishing process, by performing the operations of causing initiation of a substrate polishing process and receiving signals corresponding to one or more processing parameters. The signals may be generated by a wireless communication apparatus disposed within a 3D printed polishing pad. The signals may be analyzed to determine processing conditions and at least one of the one or more processing parameters may be changed in response to the processing conditions.

In some embodiments, an RFID tag may be disposed within or coupled to a polishing pad and a reader may be disposed within a platen or polishing head. In another embodiment, an RFID tag may be disposed within or coupled to a retaining ring and a reader may be disposed within a platen. In another embodiment, an RFID tag may be disposed within or coupled to a membrane and a reader may be disposed within a platen. Various sensors may be coupled to the RFID tag to provide in-situ monitoring, sensing, and metrology functionality.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

FIG. 1B illustrates a more detailed cross-sectional view of a carrier head of the polishing apparatus of FIG. 1A according to embodiments described herein.

FIG. 7 illustrates an electrical component schematic diagram of an RFID tag according to embodiments described herein.

FIG. 8 illustrates a partial, cross-sectional view of a polishing head retaining ring and platen incorporating near field communication components according to embodiments described herein.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the disclosure generally include CMP apparatus and methods for manufacturing and using the same. CMP apparatus may include polishing pads, polishing head retaining rings, and polishing head membranes, among others, and the CMP apparatus may be manufactured via additive manufacturing processes, such as three dimensional (3D) printing processes. The CMP apparatus may include wireless communication apparatus, such as radio frequency identification (RFID) or other components integrated therein. Methods of manufacturing CMP apparatus include 3D printing an RFID tag into or onto a polishing pad and printing a polishing pad with a recess configured to receive an RFID tag.

Figure 1A:
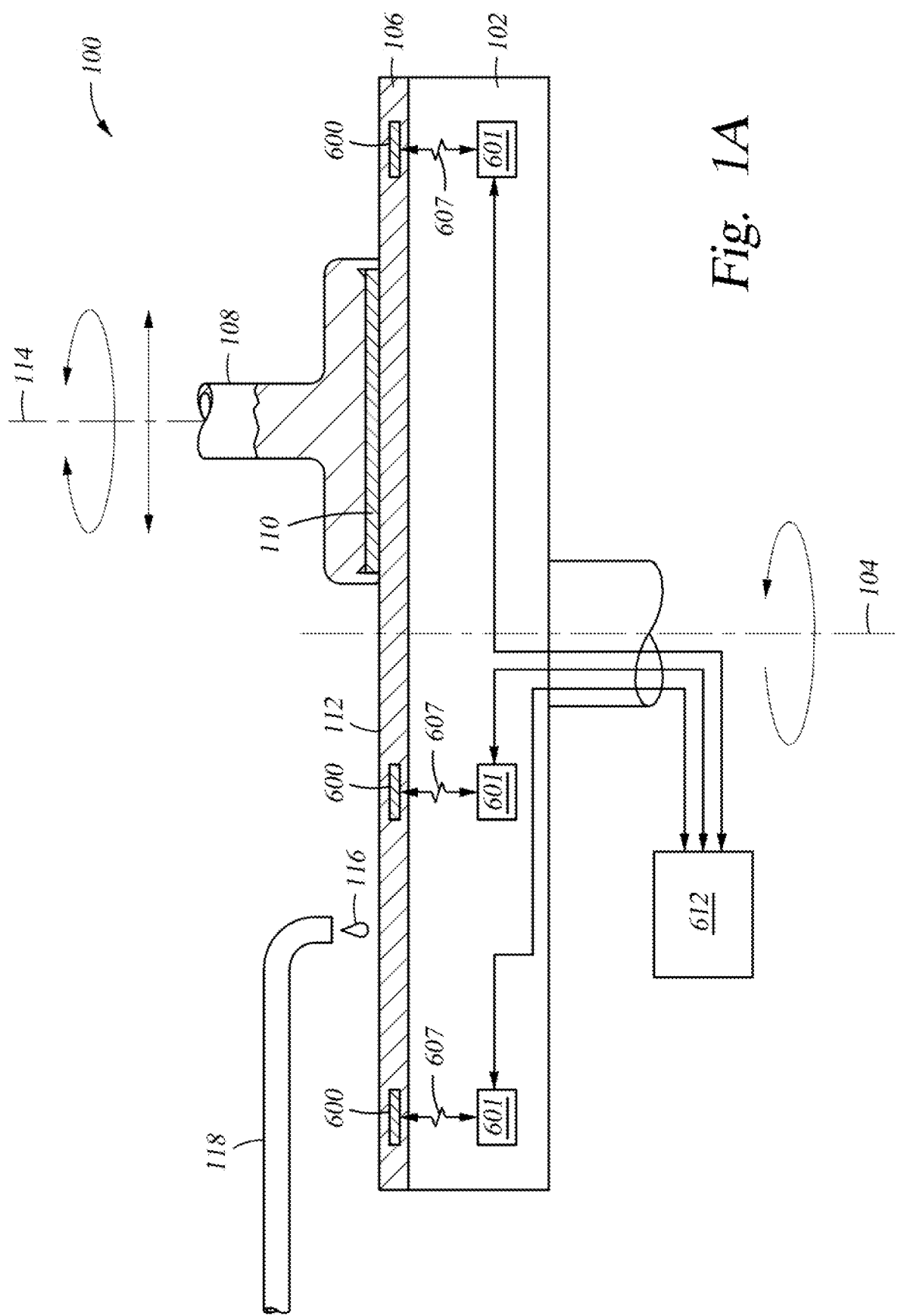
FIG. 1A illustrates a schematic sectional view of a polishing apparatus according to embodiments described herein.

FIG. 1A illustrates a schematic sectional view of a polishing apparatus 100 according to embodiments described herein. The polishing apparatus 100 may be utilized in a polishing system to perform substrate polishing. The polishing station 100 includes a platen 102 which may rotate about a central axis 104. The platen 102 is generally circular in shape, but it is contemplated that other shapes may be advantageously utilized. A polishing pad 106 may be coupled to the platen 102. Although illustrated as a single polishing pad 106 coupled to the platen 102, it is contemplated that multiple polishing pads may also be coupled to the platen depending upon desired polishing characteristics. The polishing pad 106 may include a mono-material layer body or a composite material body according to embodiments of the present disclosure. The polishing pad 106 includes a polishing surface 112 configured to contact and process substrates by removing at least some material from the substrate. The platen 102 supports the polishing pad 106 and rotates the polishing pad 106 during polishing.

A carrier head 108 may secure and hold a substrate 110 being processed against the polishing surface 112 of the polishing pad 106. The carrier head 108 may rotate about a central axis 114 and/or move in a sweeping motion to generate relative motion between the substrate 110 and the polishing pad 106. During polishing, a polishing fluid 116, such as an abrasive slurry, may be supplied to the polishing surface 112 by a delivery arm 118. The polishing liquid 116 may contain abrasive particles, a pH adjuster, and/or chemically active components to enable chemical mechanical polishing of the substrate 110.

One or more wireless communication apparatus 600 may be disposed within or otherwise coupled to the polishing pad 106. One or more interrogators 601 may be disposed within or otherwise coupled to the platen 102. The wireless communication apparatus 600 and the interrogator 601 are configured to communicate via a communication link 607. In one embodiment, the communication link 607 may be a wireless communication protocol. In another embodiment, the communication link 607 may be a wired connection. The interrogator is communicatively coupled to a controller 612 which may receive input from the wireless communication apparatus 600 via the interrogator 601. The wireless communication apparatus 600, the interrogator 601, and the controller are discussed in greater detail with reference to FIG. 6.

Generally, the wireless communication apparatus 600 is configured to sense various processing parameters and system components. The wireless communication apparatus 600 may be positioned at various locations within the polishing pad 106 and may provide for improved data collection over the entire polishing surface 112, which may be analyzed by the controller 112 to improve the control of the polishing process. Data collected via the wireless communication apparatus 600 may be utilized for real time process control and/or to ensure utilization of compatible system components, such as a suitable retaining ring 120 or flexible membrane (not shown), among other system components. In these embodiments, the other suitable system components may also employ wireless communication apparatus to communicate with the interrogator 601.

FIG. 1B illustrates a more detailed cross-sectional view of the carrier head 108 of the polishing apparatus 100 of FIG. 1A according to embodiments described herein. As described above, the carrier head 108 is configured to hold the substrate 110 during polishing or other processing. The carrier head 108 may hold the substrate 110 against the polishing pad 106 supported by the rotatable platen 102 and distribute a pressure across a back surface 136 of the substrate 110 toward the polishing pad 106.

The carrier heads 108 includes a base assembly 140 (which may be coupled directly to or indirectly to a rotatable drive shaft 130), a retaining ring 120, and a flexible membrane 132. The flexible membrane 132 extends below and is coupled with the base assembly 140 to provide multiple pressurizable chambers, including a non-circular inner chamber 122a and an adjacent outer chamber 122b. Passages 124a and 124b are formed through the base assembly 140 to fluidly couple the chambers 122a and 122b, respectively, to pressure regulators in the polishing apparatus 100. Although FIG. 1B illustrates two pressurizable chambers, the carrier head 108 may have any number of chambers, for example, three, four, five, or more chambers.

Although not shown, the carrier head 108 may include other elements, such as a housing that is securable to the drive shaft 130 and from which the base assembly 140 is movably suspended, a gimbal mechanism (which may be considered part of the base assembly 140) that allows the base assembly 140 to pivot, a loading chamber between the base assembly 140 and the housing, one or more support structures inside the chambers 122a and 122b, or one or more internal membranes that contact the inner surface of the flexible membrane 132 to apply supplemental pressure to the substrate 110.

The flexible membrane 132 may be hydrophobic, durable, and chemically inert in relation to the polishing process. The flexible membrane 132 may include a mounting portion 138 configured to contact the back surface 136 of the substrate 110. One or more flaps 134 may couple the mounting portion 138 to the base assembly 140 via clamp rings 126, 128. The one or more flaps 134 may divide the chambers 122a, 122b to provide for areal pressure control across the substrate 110.

The retaining ring 120 may be coupled to the base assembly 140 radially outward of the flexible membrane 132. Generally, the retaining ring 120 is configured to prevent excessive movement of the substrate 110 relative to the flexible membrane 132 and to prevent lateral movement of the substrate 110. The retaining ring may be made from materials which are inert to chemical compositions utilized in a polishing process. It is contemplated that the retaining ring 120 may be made from suitable materials, such as polymers, ceramics, and metals, depending upon the desired applications.

Advanced Pad Configurations and Design Examples

Figure 2:
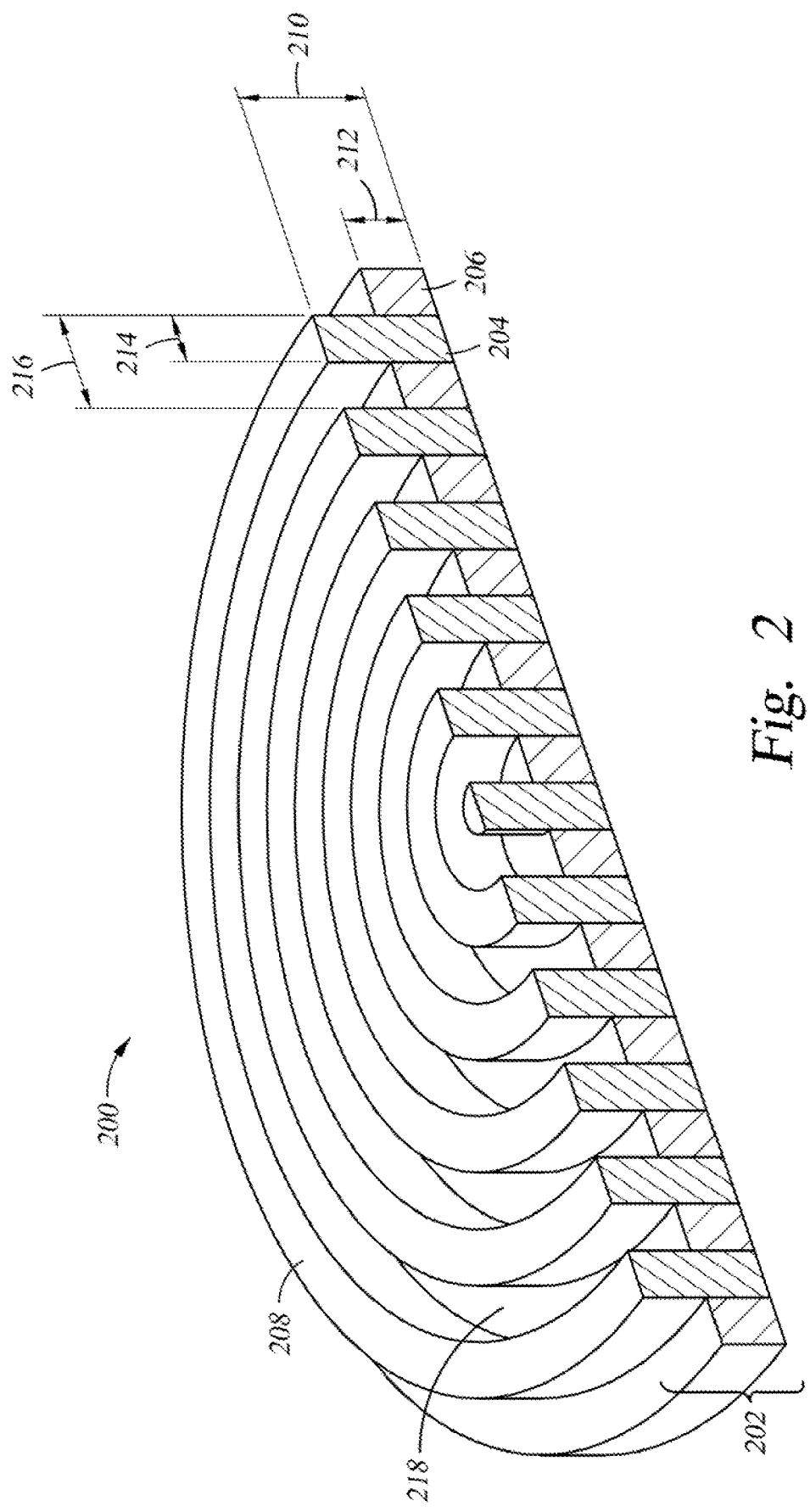
FIG. 2 is a schematic perspective sectional view of a polishing pad according to embodiments described herein.

FIG. 2 is a schematic perspective sectional view of a polishing pad 200 according to embodiments described herein. The polishing pad 200 may be used in polishing stations, such as the polishing station 100, for polishing semiconductor substrates by chemical mechanical polishing. It is contemplated that other industries may utilize other types of substrates which may be advantageously processed utilizing polishing pads according to the embodiments described herein. For example, optical industries may polish various lenses or mirrors utilizing pads and other associated apparatus described herein.

In the illustrated embodiment, the polishing pad 200 includes a composite pad body 202. Although not illustrated, it is contemplated that the polishing pad body 202 may be formed from a single material, instead of multiple materials. The composite pad body 202 includes one or more first features 204 and one or more second features 206. The first features 204 and the second features 206 are discrete features that are joined together at their boundaries to form the composite pad body 202. In one embodiment, the first features 204 may have a hardness of about 40 Shore D scale to about 90 Shore D scale. The second features 206 may have a hardness value between about 26 Shore A scale to about 95 Shore A scale.

The composite pad body 202 may be formed by additive manufacturing (e.g., 3D printing) or other suitable techniques, such as casting or molding techniques. The composite pad body 202 may include a plurality of layers, each including regions of the second features 206 and/or regions of first features 204 according to the design of the composite pad body 202. In one embodiment, each region, which includes first features 204 and/or second features 206, may be deposited by a 3D printer in a simultaneous or sequential printing process. The plurality of layers may then be cured, for example by UV light or by a heat source, to solidify and achieve a target hardness. After deposition and curing, a unitary composite pad body 202 is formed including the first features 204 and the second features 206 that are coupled or joined together. A curing process may or may not be necessary in embodiments relating to non-composite polishing pads.

Materials having different mechanical properties may be selected for the second features 206 and the first features 204 to achieve a target polishing process. The dynamic mechanical properties of the second features 206 and the first features 204 may be achieved by selecting different materials and/or choosing different curing processes used during the feature forming process. In one embodiment, the second features 206 may have a lower hardness value and a lower value of elastic modulus, while the first features 204 may have a higher hardness value and a higher value of elastic modulus. In another embodiment, the dynamic mechanical properties, such as elastic modulus (or storage modulus) and loss modulus, may be adjusted or controlled within each feature and/or by the physical layout, pattern or combination of second features 206 and first features 204 within or across the polishing surface of the polishing pad 200.

The first features 204 may be formed from one or more polymer materials. The material(s) used to form the first features 204 may include a single polymer material or a mixture of two or more polymers to achieve target mechanical, surface, chemical, or thermal properties. In one embodiment, the first features 204 may be formed from one or more thermoplastic polymers. The first features 204 may be formed from thermoplastic polymers, such as polyurethane, polypropylene, polystyrene, polyacrylonitrile, polymethyle methacrylate, polychlorotrifluoroethylene, polytetrafluoroethylene, polyoxymethylene, polycarbonate, polyimide, polyetheretherketone, polyphenylene sulfide, polyether sulfone, acrylonitrile butadiene styrene (ABS), polyetherimide, polyamides, melamines, polyesters, polysulfones, polyvinyl acetates, fluorinated hydrocarbons, and the like, and acrylates, copolymers, grafts, and mixtures thereof. In one embodiment, the first features 204 may be formed from acrylates. For example, the first features 204 may be polyurethane acrylate, polyether acrylate, or polyester acrylate. In another embodiment, the first features 204 may include one or more thermosetting polymers, such as epoxies, phenolics, amines, polyesters, urethanes, silicon, and acrylates, mixtures, copolymers, and grafts thereof.

In one embodiment, the first features 204 may be formed from a simulating plastic 3D printing material. In another embodiment, the first features 204 may be formed from a polymeric material, which may be a single polymer or a combination of polymers, or a thermoplastic material, such as a thermoplastic polymer. In one embodiment, abrasive particles may be embedded in the first features 204 to enhance the polishing process. The material comprising the abrasive particles may be a metal oxide, such as ceria, alumina, silica, or a combination thereof, a polymer, an inter-metallic or ceramic.

The material(s) used to form the second features 206 may include one or more polymer materials. The second features 206 may be formed from a single polymer material or a mixture of two more polymers to achieve target properties. In one embodiment, the second features 206 may be formed from one or more thermoplastic polymers. For example, the second features 206 may be formed from thermoplastic polymers, such as polyurethane, polypropylene, polystyrene, polyacrylonitrile, polymethyl methacrylate, polychlorotrifluoroethylene, polytetrafluoroethylene, polyoxymethylene, polycarbonate, polyimide, polyetheretherketone, polyphenylene sulfide, polyether sulfone, acrylonitrile butadiene styrene (ABS), polyetherimide, polyamides, melamines, polyesters, polysulfones, polyvinyl acetates, fluorinated hydrocarbons, and the like, and acrylates, copolymers, grafts, and mixtures thereof. In one embodiment, the second features 206 may be formed from acrylates. For example, the second features 206 may be polyurethane acrylate, polyether acrylate, or polyester acrylate. In another embodiment, the second features 206 may be formed from thermoplastic elastomers. In one embodiment, the second features 206 may be formed from a rubber-like 3D printing material.

In some embodiments, the first features 204 are harder and more rigid relative to the second features 206, while the second features 206 are softer and more flexible relative to the first features 204. Materials and patterns of the first features 204 and the second features 206 may be selected to achieve a "tuned" bulk material of the polishing pad 200. The polishing pad 200 formed with this "tuned" bulk material has various advantages, such as improved polishing results, reduced cost of manufacturing, elongated pad life. In one embodiment, the "tuned" bulk material or the polishing pad as a whole may have a hardness between about 65 shore A to about 75 shore D. Tensile strength of the polishing pad may be between 5 MPa to about 75 MPa. The polishing pad may have about 5% to about 350% elongation to break. The polishing pad may have shear strength above about 10 MPa. The polishing pad may have storage modulus between about 5 MPa to about 2000 MPa. The polishing pad may have a stable storage modulus over a temperature range between about 25° C. to about 90° C. such that a storage modulus ratio at E30/E90 falls within the range between about 6 to about 30, wherein E30 is the storage modulus at 30° C. and E90 is the storage modulus at 90° C.

In one embodiment, the materials of the first features 204 and second features 206 are chemically resistant to attack from the polishing slurry. In another embodiment, the materials of the first features 204 and second features 206 are hydrophilic.

Generally, the first features 204 and the second features 206 may be alternating concentric rings alternately arranged to form a circular composite pad body 202. In other embodiments, the first features 206 and the second features 106 may be discrete posts extending from the body 202 in an alternating or other suitable arrangement. It is contemplated that various other polishing pad surface designs may also be utilized advantageously with the embodiments described herein. In one embodiment, a height 210 of the first features 204 is higher than a height 212 of the second features 206 so that upper surfaces 208 of the first features 204 protrude from the second features 206. Grooves 218 or channels are formed between the first features 204 and the second features 206. During polishing, the upper surfaces 208 of the first features 204 form a polishing surface that contacts the substrate, while the grooves 218 retains the polishing fluid. In one embodiment, the first features 204 are formed with a thickness greater than a thickness of the second features 206 in a direction normal to a plane parallel to the composite pad body 202 so that the grooves 218 and/or channels are formed on the top surface of the composite pad body 202.

In one embodiment, a width 214 of the first features 204 may be between about 250 microns to about 2 millimeters. The pitch 216 between the first features 204 may be between about 0.5 millimeters to about 5 millimeters. Each first feature 204 may have a width 214 within a range between about 250 microns to about 2 millimeters. The width 214 and/or the pitch 216 may vary across a radius of the polishing pad 200 to zones of varied hardness.

Compared with traditional polishing pads, the composite polishing pad 200 of the present disclosure has several advantages. Traditional polishing pads generally include a polishing layer with a textured polishing surface and/or an abrasive materials supported by a subpad formed from a soft material, such as a foam, to obtain target hardness or elastic modulus for polishing substrates. By selecting materials having various mechanical properties, such as Poisson's ratio, elastic modulus and loss modulus, and adjusting the dimensions and spacing of the features or varying arrangement of the different features, desirable hardness, dynamic properties and/or mechanical properties may be achieved in the composite pad body 202 without using a subpad. Therefore, the polishing pad 200 reduces cost of ownership by eliminating subpads. Additionally, hardness and abrasiveness of the polishing pad 200 may be tuned by mixing features with different hardness and abrasiveness, therefore, improving polishing performance.

Composite polishing pads according to the present disclosure may have differing mechanical properties, such as elastic modulus (Young's modulus) and loss modulus, across surface features, such as the first features 204, and base materials, such as the second features 206, by adjusting the pattern variation and/or feature size variation. Mechanical properties across the polishing pads may be symmetric or non-symmetric, uniform or non-uniform to achieve target properties. The pattern of the surface features may be radial, concentric, rectangular, or random according to achieve target property, such as a predetermined mechanical properties, such as elastic modulus and loss modulus, across the polishing pad. In some embodiments, the first features and the second features may be interlocked to improve the strength of the composite polishing pad and improve physical integrity of the composite polishing pad. Interlocking of the first features and second features may increase sheer strength, compression strength and/or tensile strength of the polishing pad.

Additive manufacturing processes, such as 3D printing, may provide advantages when incorporating various sensing apparatus in the polishing pad. Sensing apparatus, such as RFID tags and metrological sensors, will be discussed in greater detail below with regard to FIGS. 6 and 7.

Figure 3:
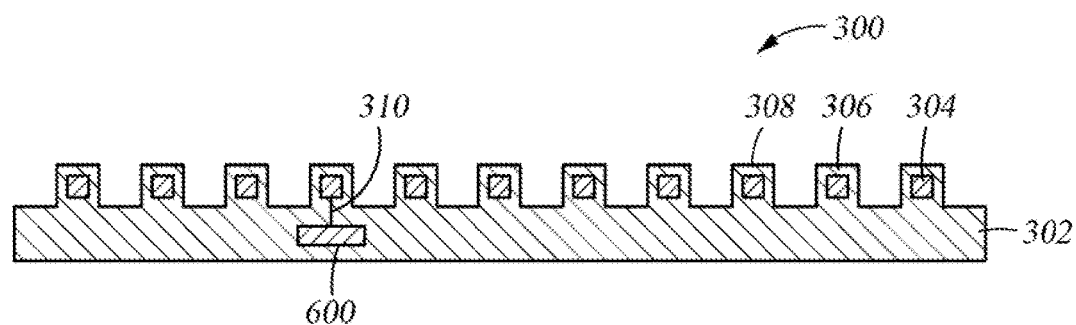
FIG. 3 is a schematic cross-sectional view of a polishing pad according to embodiments described herein.

FIG. 3 is a schematic cross-sectional view of a polishing pad 300 according to embodiments described herein. The polishing pad 300 includes a base layer 302 that is soft and elastic similar to an embodiment of the second features 206 of the polishing pad 200. Similar to the second features 206, the base layer 302 may be formed from one or more elastomeric polymers. The polishing pad 300 includes a plurality of surface features 306 extending from the base layer 302. Outer surfaces 308 of the surface features 306 may be formed from a soft material or a composition of soft materials. In one embodiment, the outer surface 308 of the surface features 306 may be formed from the same material or the same composition of materials as the base layer 302. The surface features 306 may also include a first feature 304 embedded therein. The first features 304 may be formed from a material or a composition of materials that is harder than the surface features 306. The first features 304 may be formed from materials similar to the material or materials of the first features 204 of the polishing pad 200. The embedded first features 304 alter the effective mechanical properties of the surface features 306, and thus can provide a pad that has desirable mechanical and/or dynamic properties for polishing. The soft polymeric layer of the outer surface 308 can be used to reduce defects and improve planarization on the substrate being polished. Alternatively, a soft polymer material may be printed on surfaces of other harder material containing polishing pads of the present disclosure to provide similar benefits.

The polishing pad 300 may also include the wireless communication apparatus 600 disposed therein. In addition to the mechanical properties provided by the first features 304, the first features 304 may also be coupled to the wireless communication apparatus 600, so that some form of electrical data (e.g., capacitance, resistances, etc.) can be collected by components in the wireless communication apparatus 600. The first features 304 may be coupled to the wireless communication apparatus 600 via a wire 310 or the like, which may be printed during a polishing pad manufacturing process. In one embodiment, the wire 310 may be printed from one or more conductive materials compatible with the materials utilized to print the polishing pad 300.

In one embodiment, the first features 304 may include conductive elements that function as a wear indicator. In some embodiments, during polishing, the surface features 306 may eventually wear away and expose the first features 304. Various signals (acoustic, electrical, pressure, etc.) received by the wireless communication apparatus 600 may be initiated when the surface features 306 are removed and the first features 304 are exposed. The change and/or generation of a signal in response to exposure of the first features 304 may cause the wireless communication apparatus 600 to communicate with the interrogator 601 (not shown) and provide processing data to the controller 612. Thus, operators of the processing system can receive real time data regarding usage and polishing parameters. In one embodiment, exposure of the first features 304 may indicate polishing pad wear and the polishing pad 300 may be replaced to ensure adequate polishing of substrates.

Figure 4:
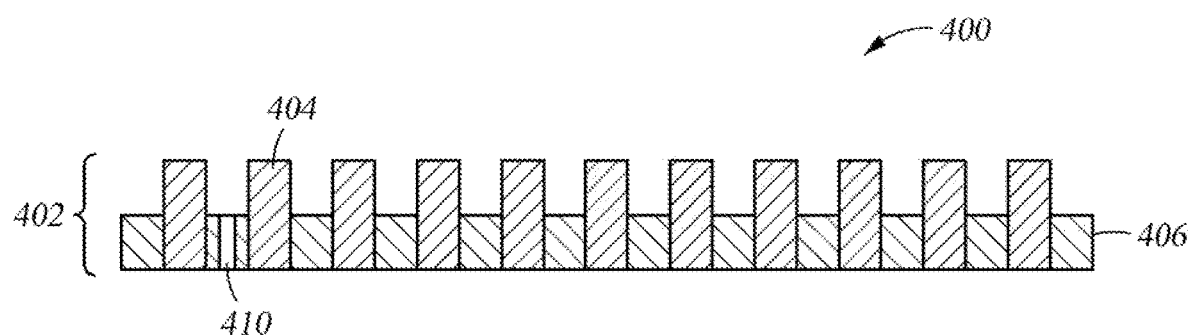
FIG. 4 is a schematic cross-sectional view of a polishing pad having one or more observation windows according to embodiments described herein.

FIG. 4 is a schematic cross-sectional view of a polishing pad 400 having one or more observation windows 410 formed therein according to embodiments described herein. The polishing pad 400 may have a pad body 402 similar to the polishing pad 200. The pad body 402 may include one or more second features 406 and a plurality of first features 404 extending from the second features 406 for polishing. The second features 406 and the first features 404 may be formed from materials similar to those for the second features 206 and first features 204 of the polishing pad 200. The first features 404 may be arranged in any suitable patterns according to the present disclosure.

The polishing pad 400 also contains one or more observation windows 410 that may be formed from a transparent material to allow observation of the substrate during polishing. The observation windows 410 may be formed through, and/or abut portions of, the second feature 406 or the first features 404. The observation window 410 may be formed while the first features 402 and second features 406 are being formed by the by use of the additive manufacturing processes. In some embodiments, the observation window 410 may be formed from a material that is substantially transparent, and thus is able to transmit light emitted from a laser and/or white light source for use in a CMP optical endpoint detection system. In one embodiment, the observation window 410 may be formed from a transparent 3D printing photopolymer. For example, the observation window 410 may be formed from polymethylmethacrylate (PMMA). In some embodiments, the observation window 410 is formed from a material that has a low refractive index that is to that of the polishing slurry and has a high optical clarity to reduce reflections from the air/window/water interfaces and improve transmission of the light through the observation window 410 to and from the substrate. The optical clarity of the material is selected to provide at least about 25% (e.g., at least about 50%, at least about 80%, at least about 90%, at least about 95%) light transmission over the wavelength range of the light beam used by the end point detection system's optical detector. Typical optical end point detection wavelength ranges include the visible spectrum (e.g., from about 400 nm to about 800 nm), the ultraviolet (UV) spectrum (e.g., from about 300 nm to about 400 nm), and/or the infrared spectrum (e.g., from about 800 nm to about 1550 nm).

Figure 5:
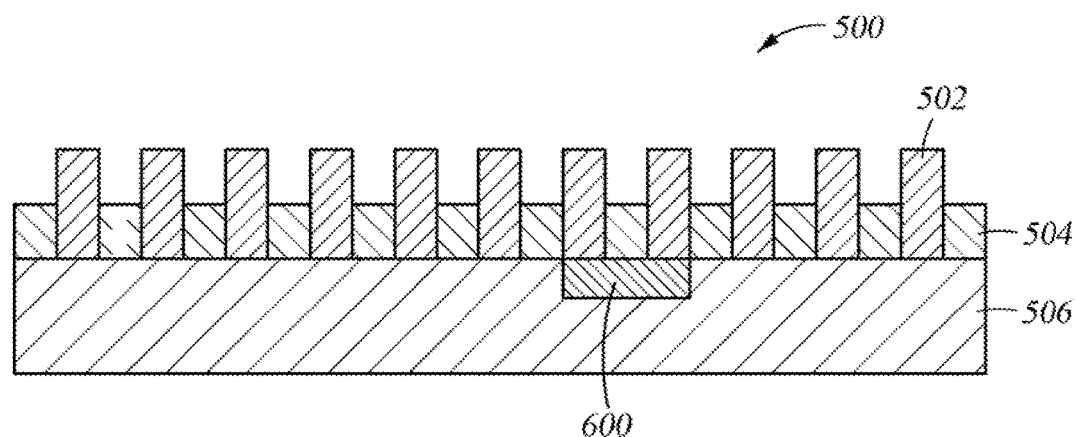
FIG. 5 is a schematic cross-sectional view of a polishing pad including a supporting layer according to embodiments described herein.

FIG. 5 is a schematic perspective sectional view of a polishing pad 500 including a backing layer 506. The polishing pad 500 includes a base material layer 504 and a plurality of surface features 502 protruding from the base material layer 504. The polishing pad 500 may be similar to the polishing pads 200, 300, 400 described above except having the backing layer 506 attached to the base material layer 504. The backing layer 506 may provide a desired compressibility to the polishing pad 500. The backing layer 506 may also be used to alter the overall mechanical properties of the polishing pad 500 to achieve a desired hardness and/or have desired dynamic material properties (e.g., elastic modulus and loss modulus). The backing layer 506 may have a hardness value of less than 80 Shore A scale.

In one embodiment, the backing layer 506 may be formed from an open-cell or a closed-cell foam, such as polyurethane or polysilicone with voids, so that when pressure is applied, the cells/voids collapse and the backing layer 506 compresses in a predictable manner. In another embodiment, the backing layer 506 may be formed from natural rubber, ethylene propylene diene monomer (EPDM) rubber, nitrile, or polychloroprene (neoprene), among others.

In one embodiment, the backing layer 506 may be formed by use of an additive manufacturing process, such as a 3D printing process. In this configuration the backing layer 506 may be formed from a single polymer material or a mixture of two more polymers to achieve desirable mechanical and dynamic material properties. In one configuration, the surface features 502 and base material layer 504 are formed directly on the backing layer 506. In one embodiment, the backing layer 506 may be formed from one or more thermoplastic polymers, and thus may include one or more of the materials described above in conjunction with the first feature 204 and/or second feature 206.

In certain embodiments, the wireless communication apparatus 600 may be disposed in or coupled to the polishing pad 500. In one embodiment, the wireless communication apparatus 600 may be disposed in the base material layer 504 or the surface features 502. In the illustrated embodiment, the wireless communication apparatus 600 may be disposed in the backing layer 506. Regardless of the position of the wireless communication apparatus 600, the wireless communication apparatus 600 may be sized to sense one or more processing parameters across multiple surface features 502. For example, two or more surface features 502 may be sensed simultaneously by the wireless communication apparatus 600. As a result, various processing parameters (temperature, pressure, conductivity, etc.) may be sensed across a larger area of the polishing surface rather than sensing a single surface feature 502. By sensing a larger area of the polishing surface, a regionally averaged signal may be detected by the wireless communication apparatus 600. In embodiments utilizing multiple wireless communication apparatus 600, a more globally averaged signal may be determined by combining data from the individual wireless communication apparatus 600.

Information Collection System Configuration Examples

Figure 6:
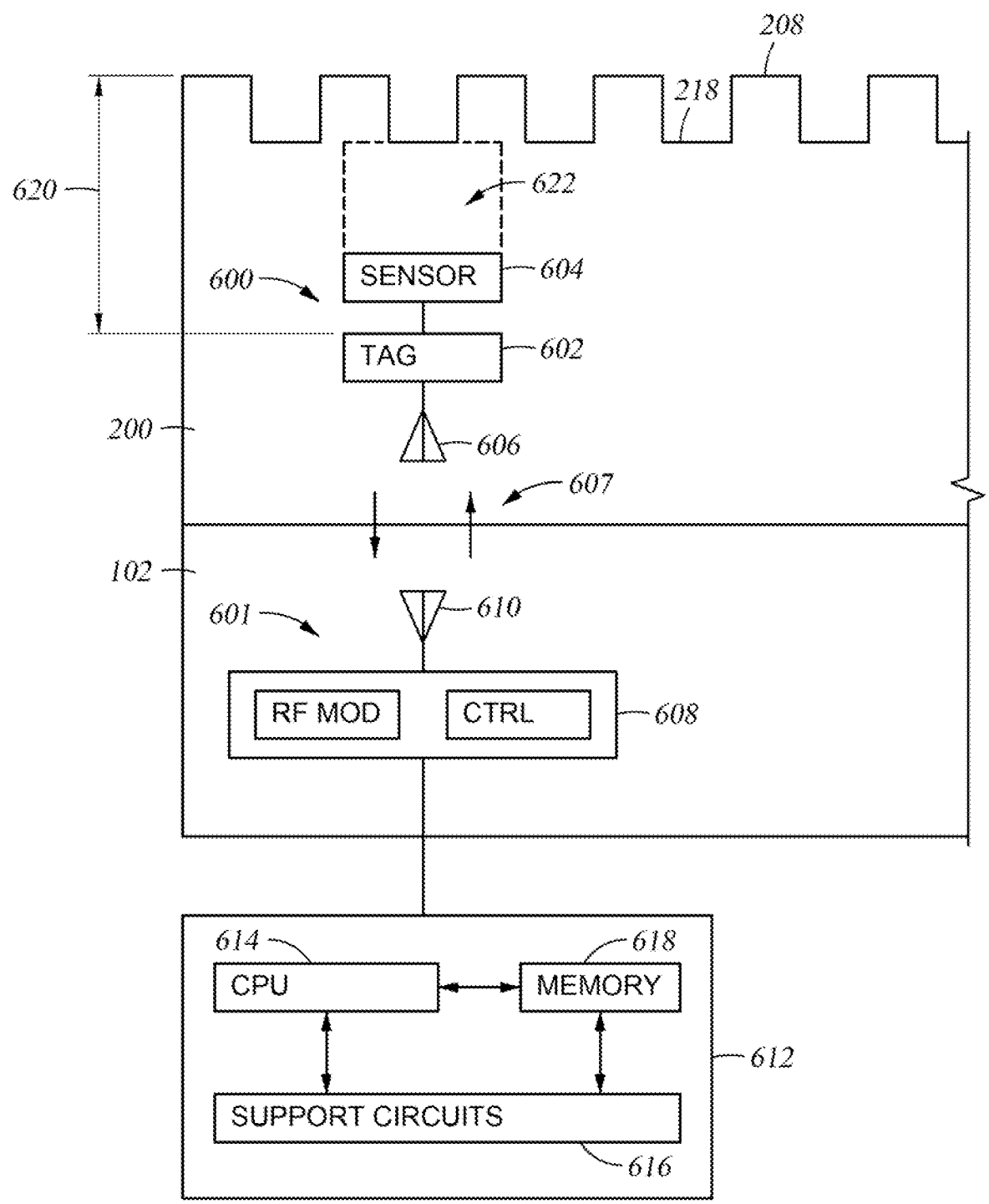
FIG. 6 illustrates a partial, schematic, cross-sectional view of a polishing pad and a platen incorporating an RFID tag and read therein, respectively, according to embodiments described herein.

FIG. 6 illustrates a partial, schematic, cross-sectional view of the polishing pad 200 and the platen 102 incorporating the wireless communication apparatus 600 and the interrogator 601 therein, respectively, according to embodiments described herein. The polishing pad 200 is intended to be representative of any polishing pad configured to incorporate integrated sensing or metrology apparatus therein. For example, the polishing pad may be printed, cast, or molded with the wireless communication apparatus 600 disposed therein. In one embodiment, the wireless communication apparatus 600 is configured to communicate wirelessly with the interrogator. Examples of wireless communication protocols include near field communication techniques, Bluetooth®, optical signal transmission techniques, acoustic signal transmission techniques, radio frequency communication techniques, and other suitable wireless communication techniques. Alternatively, the wireless communication apparatus 600 may be hardwired to the interrogator 601 to facilitate communication therebetween.

While a single wireless communication apparatus 600 and a single interrogator 601 are illustrated in FIG. 6, it is contemplated that multiple wireless communication apparatus 600 and interrogators 601 may be implemented in pads and platens, respectively (See FIG. 1). In addition, one or more wireless communication apparatus 600 may be sensed by a single interrogator 601. It is also contemplated that wireless communication apparatus 600 may be positioned within or on a surface of the pad 200 at various locations, such as a center location (i.e. at the origin or rotational axis coincident point of a circular pad), a middle location (i.e. ½ the radius from the origin of a circular pad), or an outer location (i.e. adjacent a circumference of a circular pad). Multiple NFC apparatus 600 may also be utilized in combination and various positions (i.e. center location and outer location or center, middle, and outer locations) may be utilized together. By utilizing multiple wireless communication apparatus 600 in concert with one another, a more comprehensive view of the processing environment will be created, due to the collection of the data at multiple locations across the pad 200. Generally, the wireless communication apparatus 600 is positioned relative to the pad 200 so that the path of the substrate 110, across the polishing surface of the polishing system 100 during processing, overlap during various points of the polishing process.

Similarly, the interrogator 601 may be positioned within the platen 102 at various locations, such as a center, a middle, and an outer location. The interrogator's location may be determined independently of the wireless communication apparatus 600 location or may be determined at least in part by the wireless communication apparatus location to facilitate communication between the wireless communication apparatus 600 and the interrogator 601.

The interrogator 601 disposed in the platen 102 generally includes a reader 608 and an antenna 610. The reader may include or be coupled to a power source, such as an RF power source, and may be configured to transmit, via the antenna 610, a signal to be received by the wireless communication apparatus 600. In one embodiment, the reader 608 may include, among other apparatus, an RF modulator and an interrogator controller configured to manage signal transmission and reception by the reader 608. In one embodiment, the RF modulator may be configured to generate and/or modulate an RF signal having a wavelength of about 13.56 MHz. In a passive tag embodiment, the interrogator 601 and the wireless communication apparatus 600 may be positioned in a spatial relationship having a distance of less than about twelve inches, for example, less than about two inches, such as less than about one inch. In an active tag embodiment, the spatial relationship between the interrogator 601 and the wireless communication apparatus 600 may be greater than the passive tag embodiments and may be depended upon the power available for signal transmission.

The wireless communication apparatus 600 generally includes a tag 602 and an antenna 606 that is coupled to or integrally manufactured in the tag 602. In certain embodiments, a sensor 604 may also be communicatively coupled to the tag 602. The tag 602 may be an active tag or a passive tag, depending upon the desired implementation. In an active tag embodiment, a power source, such as a battery, may be electrically coupled to the tag and provide suitable power to the tag so the tag can transmit a signal to an interrogator 601 via the communication link 607 formed between the devices. It is contemplated that an active tag may be implemented in embodiments where power is coupled to the tag. Additionally, an active tag may be utilized in embodiments where data transmitted by the tag is intended to be sensed by an interrogator 601 at a distance greater than may be obtained when using a passive tag.

However, it is contemplated that an active tag may be utilized in near field communication embodiments where a passive tag would find suitable utilization.

In a passive tag embodiment, the tag may be configured to receive a signal, such as a radio frequency signal from the interrogator 601, and utilize the electromagnetic energy of the received signal to transmit (or reflect) a signal containing some amount of data unique to the tag 602 back to the interrogator 601 via the communication link 607. A passive tag may be utilized in embodiments where an interrogator 601 is positioned less than a critical communication distance from the tag 602. The critical communication distance is generally defined as the distance beyond which electromagnetic signals reflected by the passive tag are not reliably received by the interrogator 601. The critical communication distance may vary according to embodiments depending upon the amount of power associated with the signal generated by the interrogator 601 and the size and power of the tag transmitter. A more detailed description of a passive tag is discussed below with reference to FIG. 7.

FIG. 7 illustrates an electrical component schematic diagram of the wireless communication apparatus 600 according to embodiments described herein. The embodiment illustrated in FIG. 7 is intended to be representative of a basic functioning tag, and thus it is contemplated that various other electrical component designs or configurations may be implemented to achieve the tag's desired functionality. The tag 602 generally includes a transistor 702, an inductor 704, a capacitor 706, and an integrated circuit 708. In one embodiment, the integrated circuit 708 may be representative of a memory configured to store data unique to the tag 602. In another embodiment, the memory may be configured to store data received by the sensor 604 prior to transmitting the data to an interrogator 601. In certain embodiments, the inductor 704, such as an inductive coil, may be utilized as an antenna to receive and transmit signals between the interrogator 601 and the inductor 704. In one embodiment, the inductor 704 is the antenna 606 and functions to inductively reflect a signal containing data from the tag 602 to an interrogator 601 via a communication link formed between the devices.

Referring back to FIG. 6, the wireless communication apparatus 600, and more specifically, the tag 602, may be positioned within the polishing pad 200 below the upper surface 208 of the pad 200, which contacts substrates during processing. In one embodiment, the wireless communication apparatus 600 is positioned a distance 620 of between about 200 μm and about 500 μm below the upper surface 208. The distance 620 may be selected based upon the desired type of sensing performed by the tag 602 and/or sensor 604 and the topography of the surface of the pad 200 (e.g., grooves, channels, or other features). In another embodiment, the tag 602 may be positioned the distance 620 below the top surface 208 but the sensor 604 may be closer to the top surface 208. While only one sensor 604 is illustrated, it is contemplated that multiple sensors may be incorporated to provide a suite of tracking, sensing, and metrology data to monitor and improve polishing performance. For example, polishing performance determined by the wireless communication apparatus 600 may be performed in-situ (i.e., during polishing) and processing parameters may be adjusted in-situ to improve substrate polishing characteristics. Processing parameters which may be sensed include temperature data, pressure data, electrical conductivity data, elastic modulus data, optical data, acoustic data, film thickness data, and other data types configured to measure processing parameters during a substrate polishing process.

In one embodiment, a region 622 of the pad 200 disposed between the sensor 604 and the polishing surface of the pad 200 may be configured to enhance the measurement of a desired processing parameter by use of the sensor 604 that is coupled to the region 622. The region 622 may extend from the sensor 604 to the top surface 208 of the pad 200 in one embodiment, or the region 622 may extend from the sensor 604 to the grooves 218 in another embodiment. By reducing "resistance" of sensing a desired processing parameter, a more accurate measurement of the processing parameter may be achieved in real time. For example, if the sensor 604 is a temperature sensor, the region 622 may be formed from a thermally conductive material which has a greater coefficient of thermal conductivity than a remainder of the pad 200. By reducing thermal resistance between the polishing surface of the pad 200 and the sensor 604, signal detection by the sensor 604 may be achieved at a greater rate.

In another example, if the sensor 604 is a pressure sensor, and the region 622 may be formed from a material having an elastic modulus greater than the remainder of the pad 200. In other words, the region 622 may be stiffer than the surrounding pad material to facilitate more accurate sensing of a pressure applied at the polishing surface. In another example, if the sensor 604 is an electrical conductivity sensor configured to detect changes in conductivity at the polishing surface, the region 622 may be formed from a material which contains regions that are more electrically conductive than the surrounding pad materials. Thus, electrical resistance in the region 622 may be reduced which may improve the data rate at which the sensor 604 received signals from the polishing surface. It is contemplated that various other sensors may be employed and suitable configured materials may be utilized in the region 622 to improve the accuracy of processing parameter detection. Generally, manufacturing of the region 622 may be advantageously employed via 3D printing processes which enable material selectivity within the pad 200 in a cost efficient and controllable manner.

The sensor 604 is intended to be representative of various types of sensing and metrology apparatus suitable for use in CMP processes. In one embodiment, the sensor 604 may be configured for polishing system identification and tracking. For example, the polishing system 100 may be configured to engage in operation when a polishing pad having the wireless communication apparatus 600 is mounted to the platen 102. In this embodiment, the interrogator 601 in the platen 102 would receive data from the tag 602 indicating the correct type of polishing pad was installed on the polishing system. After authentication of polishing pad type via the tag data received by the interrogator 601, the polishing system 101 would "unlock" and engage in full polishing functionality. In some embodiments, after authentication of polishing pad type via the received tag data, the polishing system 101 adjusts one or more polishing parameters based on the received tag data. In one example, the received tag data may include information relating to the polishing pad type, pad configuration (e.g., surface features 502, base material layer 504, and backing layer 506 types, thickness), surface structure of the pad 200, or other useful information.

In another embodiment, the sensor 604 may be used to track usage statistics of polishing pads installed on the polishing system 100. For example, the number of cycles a pad has been utilized may be tracked by the wireless communication apparatus 600 and that data may be transmitted to the interrogator 601. The data may be interpreted and pad lifetime may be more accurately tracked to ensure pad replacement at intervals which provide for improved polishing characteristics. In some embodiments, the polishing system 101 adjusts one or more polishing parameters based on the tracked usage statistics of the polishing pad that was received in the transmitted tag data.

In some embodiments, the sensor 604 (or multiple sensors in certain embodiments) may be configured to detect one or more polishing parameters. In one example, the sensor 604 may be a thermal sensor (e.g., RTD, thermocouple) that includes components that are configured to detect the temperature of the polishing pad 200, the slurry, the substrate 110, or any combinations thereof. In another example, the sensor 604 may be an acoustic sensor (not shown) configured to determine acoustic vibrational changes during a polishing process. A conductivity sensor is another type of sensor 604 which may be utilized in the wireless communication apparatus 600. In this example, the conductivity sensor (not shown) may be configured to detect metal loading in the slurry (i.e. the increase in metal concentration) or a conductivity change across the surface of the pad 200 as a result of slurry clearing from various regions of the pad 200. In one configuration, the conductivity sensor may include two electrodes (not shown) that are in communication with the tag 602 and wireless communication apparatus 600 and each are exposed at the polishing surface 208. The exposed electrodes can then be used to directly measure the conductivity of the slurry, substrate surface and/or surface of the pad 200 by applying a voltage across the electrodes by use of components found in the tag 602. In some embodiments, the polishing system 101 adjusts one or more polishing parameters based on the one or more polishing parameter data received in transmitted tag data that is delivered to the interrogator 601 from the tag 602.

Another example of a sensor 604 is an accelerometer (e.g., MEMS device) which may be configured to sense changes in angular momentum, dynamic forces, vibrational movement out of plane relative to an angular direction of rotation, and/or torque. An additional example of a sensor 604 is a friction sensor, such as a strain gauge, for sensing sheer stress of the pad 200 against the substrate 110 during polishing. Yet another embodiment of a sensor 604 is a pressure sensor, such as a load cell (e.g., MEMS load cell), which may be configured to measure force applied to the pad 200 and zonal pressure (i.e. chamber 122a, 122b) across the substrate 110. In some embodiments, the polishing system 101 adjusts one or more CMP polishing parameters based on the accelerometer, friction sensor, sheer stress and/or load data transferred from the tag 602 to the interrogator 601.

The aforementioned sensor embodiments may be utilized alone or in combination with one another to more effectively measure processing parameters during polishing. It is contemplated that in-situ processing and/or real time adjustments to the polishing process may be implemented to improve, for example, polishing uniformity and polishing end point detection. Generally, signals generated by the sensor 604 in response to one or more detected processing parameters may be encoded by the tag 602 and transmitted by the antenna 606. The polishing system 101 is configured to adjust one or more polishing process parameters based on the sensor data received in the transmitted tag data that is delivered to the interrogator 601 and controller 612 from the tag 602.

The interrogator 601 may also be communicatively coupled to a processor based system controller such as controller 612. For example, the controller 612 may be configured to cause generation of a signal by the reader 608. The controller 612 may also be configured to receive and analyze data received from the wireless communication apparatus 602 via the interrogator 601. The controller 612 includes a programmable central processing unit (CPU) 614 that is operable with a memory 618 (e.g., non-volatile memory) and a mass storage device, an input control unit, and a display unit (not shown), such as power supplies, clocks, cache, input/output (I/O) circuits, and the like, coupled to the various components of the polishing apparatus 100 to facilitate control of the substrate polishing process. The controller 612 may also include hardware for monitoring substrate processing through system level sensors in the polishing apparatus 100.

To facilitate control of the polishing apparatus 100 as described above, and more specifically, the wireless communication apparatus 600 and the interrogator 601, the CPU 614 may be one of any form of general purpose computer processor that can be used in an industrial setting, such as a programmable logic controller (PLC), for controlling various chambers and sub-processors. The memory 618 is coupled to the CPU 614 and the memory 618 is non-transitory and may be one or more of readily available memory such as random access memory (RAM), read only memory (ROM), floppy disk drive, hard disk, or any other form of digital storage, local or remote. Support circuits 616 are coupled to the CPU 614 for supporting the processor in a conventional manner. Signal generation instructions, data reception, and analysis from the wireless communication apparatus 600 via the interrogator 601 may be performed by and stored in the memory 618, typically as a software routine. The software routine may also be stored and/or executed by a second CPU (not shown) that is remotely located from the hardware being controlled by the CPU 618.

The memory 618 is in the form of computer-readable storage media that contains instructions, that when executed by the CPU 614, facilitates the operation of the polishing apparatus 100, including operation of the wireless communication apparatus 600 and the interrogator 601. The instructions in the memory 618 are in the form of a program product such as a program that implements the method of the present disclosure. The program code may conform to any one of a number of different programming languages. In one example, the disclosure may be implemented as a program product stored on computer-readable storage media for use with a computer system. The program(s) of the program product define functions of the embodiments (including the methods described herein). Illustrative computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored. Such computer-readable storage media, when carrying computer-readable instructions that direct the functions of the methods described herein, are embodiments of the present disclosure.

FIG. 8 illustrates a partial, cross-sectional view of the polishing head 108 illustrating the retaining ring 120 and platen 102 incorporating the wireless communication apparatus 600 according to embodiments described herein. The retaining ring 120 is generally configured and positioned to prevent undesirable movement of the substrate 110 during polishing processes. As illustrated, the retaining ring 120 may be disposed radially outward of the flexible membrane 132. Accordingly, the retaining ring 120 is disposed adjacent to and in close proximity with the pad 106 and platen 102. In certain embodiments, the retaining ring 120 may be removably coupled to the polishing head 108 to facilitate replacement of the retaining ring 120, if desired.

In one embodiment, the wireless communication apparatus 600 may be disposed on or define a surface of the retaining ring 120 facing the pad 106. Alternatively, the wireless communication apparatus 600 may be disposed at another location within the retaining ring 120 away from the surface of retaining ring 120 facing the pad 106. The wireless communication apparatus 600 and the interrogator 601 may be disposed within such proximity to allow for near field communication during polishing processes. Thus, it may be advantageous to incorporate one or more sensors, such as the sensors described above, into the retaining ring 120.

In one embodiment, the retaining ring 120 and the wireless communication apparatus 600 may be manufactured by a 3D printing process. The 3D printing process may enable concurrent fabrication of the retaining ring 120 and the wireless communication apparatus 600. Alternatively, a void may be maintained during 3D printing of the retaining ring 120 and a pre-manufactured wireless communication apparatus may be subsequently inserted into the void. In certain embodiments, the wireless communication apparatus 600 may provide processing data regarding revolutions of the polishing head 108 through the polishing system 100. It is also contemplated that the retaining ring 100 and the wireless communication apparatus 600 may be utilized to "lock" operation of the polishing system 100 unless suitably configured components, such as the pad 106, the platen 102, and the polishing head 108, are each installed on the polishing system 100. Other polishing process parameter monitoring and sensing, such as thermal, conductivity, pressure, stress, and acoustic sensing may also be detected by the wireless communication apparatus 600 disposed in the retaining ring 120.

Figure 9:
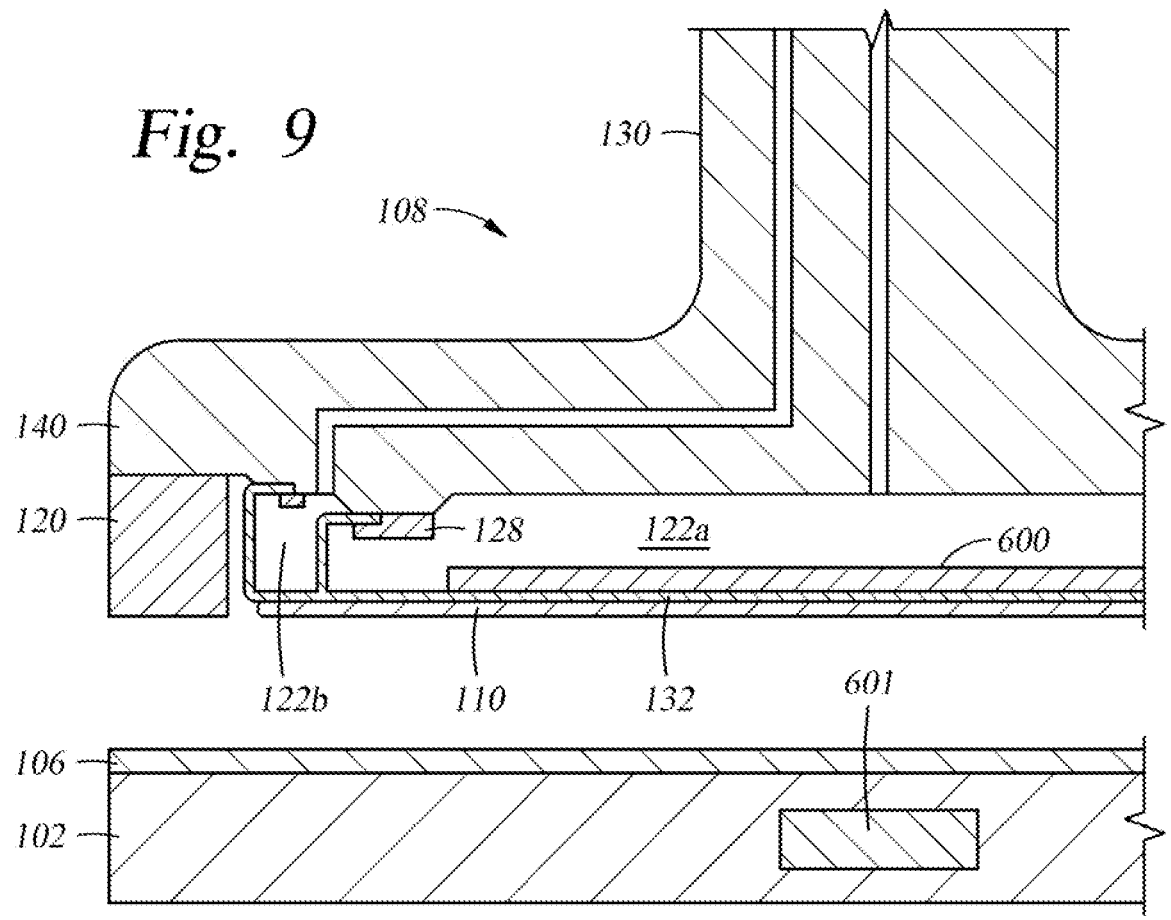
FIG. 9 illustrates a partial, cross-sectional view of a polishing head membrane and platen incorporating near field communication components according to embodiments described herein.

FIG. 9 illustrates a partial, cross-sectional view of the flexible membrane 132 and platen 102 incorporating the wireless communication apparatus 600 according to embodiments described herein. The flexible membrane 132 is generally configured to secure the substrate 110 thereon and urge the substrate 110 against the pad 106 during polishing. The flexible membrane 132 generally utilizes a pressure gradient to couple the substrate 110 thereon prevent undesirable movement of the substrate 110 during polishing processes. In certain embodiments, the flexible membrane 132 may be removably coupled to the polishing head 108 to facilitate replacement of the flexible membrane 132, if desired.

In one embodiment, the wireless communication apparatus 600 may be disposed on or define a surface of the flexible membrane 132 defining either or both of the chambers 122a, 122b. Alternatively, one or more of the wireless communication apparatus 600 may be disposed within a portion of the flexible membrane 132. Accordingly, the flexible membrane 132 is disposed adjacent to and in close proximity with the rear surface of a substrate 110 that is being urged against the pad 106 and platen 102. The wireless communication apparatus 600 and the interrogator 601 may be disposed within such proximity to allow for near field communication during polishing processes. Thus, it may be advantageous to incorporate one or more sensors, such as the sensors described above, into the flexible membrane 132.

In one embodiment, the flexible membrane 132 and the wireless communication apparatus 600 may be manufactured by a 3D printing process. The 3D printing process may enable concurrent fabrication of the flexible membrane and the wireless communication apparatus 600. In this embodiment, the wireless communication apparatus 600 may be disposed wholly or partially within the flexible membrane 132. In this example, it is contemplated that the wireless communication apparatus 600 may exhibit a suitable degree of flexibility to accommodate flexing of the flexible membrane 132. Alternatively, a void may be maintained during 3D printing of the flexible membrane 132 and a pre-manufactured wireless communication apparatus may be subsequently inserted into the void.

Similar to the wireless communication apparatus disposed within the retaining ring 120, the wireless communication apparatus 600 may provide processing data regarding revolutions of the polishing head 108 including the flexible membrane 132 through the polishing system 100. In another embodiment, the wireless communication apparatus 600 may provide processing data regarding pressurization and depressurization cycles of the flexible membrane 132. It is also contemplated that the flexible membrane 132 and the wireless communication apparatus 600 may be utilized to "lock" operation of the polishing system 100 unless suitably configured components, such as the pad 106, the platen 102, and the polishing head 108 containing the flexible membrane 132, are each installed on the polishing system 100. As described above, the flexible membrane 132 incorporating the wireless communication apparatus 600 may be especially useful in providing monitoring and sensing of pressure data applied against the substrate 110. Other polishing process parameter monitoring and sensing, such as thermal, conductivity, stress, and acoustic sensing may also be performed by the wireless communication apparatus 600 disposed in the flexible membrane 132.

It is contemplated that the embodiments of FIG. 8 and FIG. 9 may be combined to provide a polishing system 100 having a wireless communication apparatus 600 disposed within both the retaining ring 120 and the flexible membrane 132. Generally, the wireless communication apparatus 600 may be configured to sense the same processing parameter at different locations within the polishing system 100 or the wireless communication apparatus 600 may be configured to sense different processing parameters. Moreover, wireless communication apparatus 600 may be manufactured into other components, such as 3D printed components, of the polishing head 108. In addition, the wireless communication apparatus 600 coupled to either the retaining ring 120 or the flexible membrane 132 may communicate with the interrogator 601, which may be fixably disposed within the platen 102. Signals received by the interrogator 601 may be analyzed by the controller 612 and the retaining ring 120 and/or flexible membrane 132 may be removed from the polishing head 108. For example, if the signal from the wireless communication apparatus 600 indicates poor processing performance of the retaining ring 120 and/or flexible membrane 132, the retaining ring 120 and/or flexible membrane 132 may be replaced. Alternatively, if the retaining ring 120 and/or flexible membrane 132 are not configured for use in the polishing head 108, the controller 612 may indicate their incompatibility and they may be replaced with suitable configured components.

The wireless communication apparatus 600 is generally configured to collect data at a millisecond data rate or greater rate. Thus, a time constant suitable for detecting and transmitting processing parameter data may be an advantage of the wireless communication apparatus 600. Improved time constants may be derived from the physical location of the wireless communication apparatus 600 relative to the parameters being detected in certain embodiments. Thus, real time parameter sensing may be performed and communicated to the controller 612 to improve polishing processes.

In addition, the wireless communication apparatus 600 may be operated continuously or intermittently. For example, if the wireless communication apparatus 600 is disposed within the pad 200, the wireless communication apparatus 600 may be configured to continuously sense various processing parameters. Alternatively, the wireless communication apparatus 600 may be operated intermittently to detect processing parameters when the substrate is being polishing in a region adjacent the wireless communication apparatus 600. Similarly, wireless communication apparatus 600 coupled to the retaining ring 120 or flexible membrane 132 may be operated continuously or intermittently. The controller 612 may be coupled to a proximity sensor (not shown) or the like which may determine the location of the polishing head 108 relative to the interrogator 601. The proximity sensor may provide a signal to the controller 612 when the polishing head is positioned in a region suitable for communication by the interrogator 601. The controller 612 may cause the interrogator 601 to initiate signal transmission between the wireless communication apparatus 600 and the interrogator 601. When the polishing head 108 (and the wireless communication apparatus 600 coupled to either the retaining ring 120 or the flexible membrane 132) is located in a position unsuitable for communication with the interrogator 601, the proximity sensor may signal to the controller 612 and the controller 612 may terminate signal transmission and/or reception from the interrogator 601.

In embodiments utilizing multiple wireless communication apparatus 600, the interrogator 601 may be configured to communicate with the multiple wireless communication apparatus 600 and coordinate polishing via the controller 612. Alternatively, multiple interrogators may be utilized. In this embodiment, a single wireless communication apparatus may be communicatively coupled to a single interrogator. It is contemplated that any number of wireless communication apparatus and interrogators may be utilized to improve polishing process monitoring and sensing. If multiple wireless communication apparatus and interrogators are utilized, various wavelength filters and/or electromagnetic shielding apparatus may be incorporated into the polishing system to reduce or eliminate undesirable crosstalk between wireless communication apparatus and/or interrogators.

Figure 10:
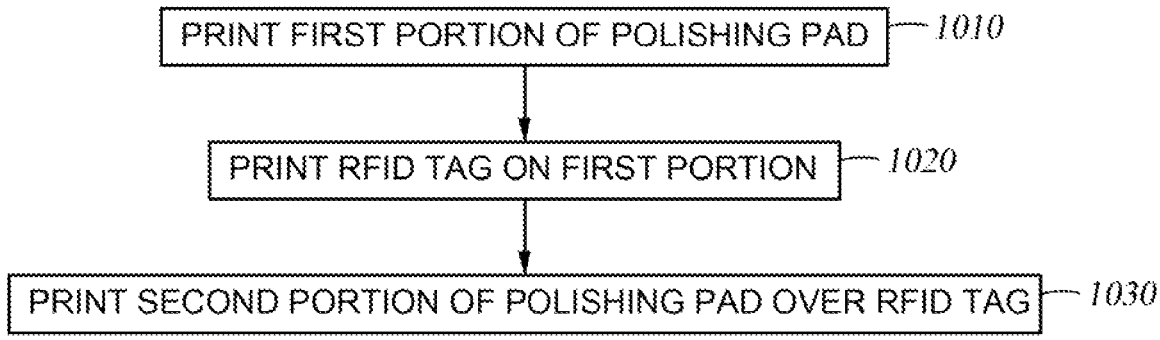
FIG. 10 illustrates a method of manufacturing a polishing pad with an RFID tag according to one embodiment described herein.

FIG. 10 illustrates a method 1000 of manufacturing a polishing pad with an RFID tag according to one embodiment described herein. While the embodiments of FIG. 10 and FIG. 11 described below are directed to additive manufacturing of a polishing pad, it is contemplated that the embodiments may be applicable to other polishing system components, such as retaining rings and flexible membranes, among others. Moreover, other manufacturing processes, such as casting and molding may be utilized to form a pad having an RFID tag disposed therein.

At operation 1010, a first portion of the polishing pad is printed. Suitable materials for the first portion may include those referenced with regard to FIG. 2, but generally include polymeric materials configured to polish a substrate. The printing process, such as a 3D printing process, is described in greater detail with regard to FIG. 12. The first portion of the polishing pad may be a base layer or a combination of pad features.

At operation 1020, wireless communication apparatus 600, such as an RFID tag, are printed on the first portion. Suitable materials for printing the RFID tag generally include conductive materials or semi-conductive materials. Examples of conductive and/or semi-conductive polymer materials include, but are not limited to, poly(fluorene), poly(phenylene), poly(pyrene), poly(azulene), poly(naphthalene), poly(acetylene), poly(p-phenylene vinylene), poly (pyrrole), poly(carbazole), poly(indole), poly(azepine), poly (aniline), poly(thiophene), poly (3,4-ethylenedioxythiphene), and poly(p-phenylene sulfide) materials, among others, including combinations and mixtures thereof. In addition, materials, such as inks, containing nano-particles of desired conducting or semiconducting properties may be utilized. For example, silver or gold nano-particles may be utilized to form a conductive ink or silicon nano-particles may be utilized to form a semiconducting ink. The aforementioned nano-particles may be incorporated into the above referenced polymer materials or may be utilized with other suitable materials. In other embodiments, various portions of the RFID tag may be printed by depositing metallic materials by an additive manufacturing process (3D Printing) or screen printing process.

At operation 1030 a second portion of the polishing pad is printed over and around the RFID tag. The second portion of the polishing pad may also be printed over the first portion of the polishing pad. As such, the RFID tag may be wholly or partially encapsulated within the polishing pad. In one embodiment, the second portion of the polishing pad may be configured to contact and polish a substrate. In another embodiment, the first portion of the polishing pad may be configured to contact and polish the substrate.

Figure 11:
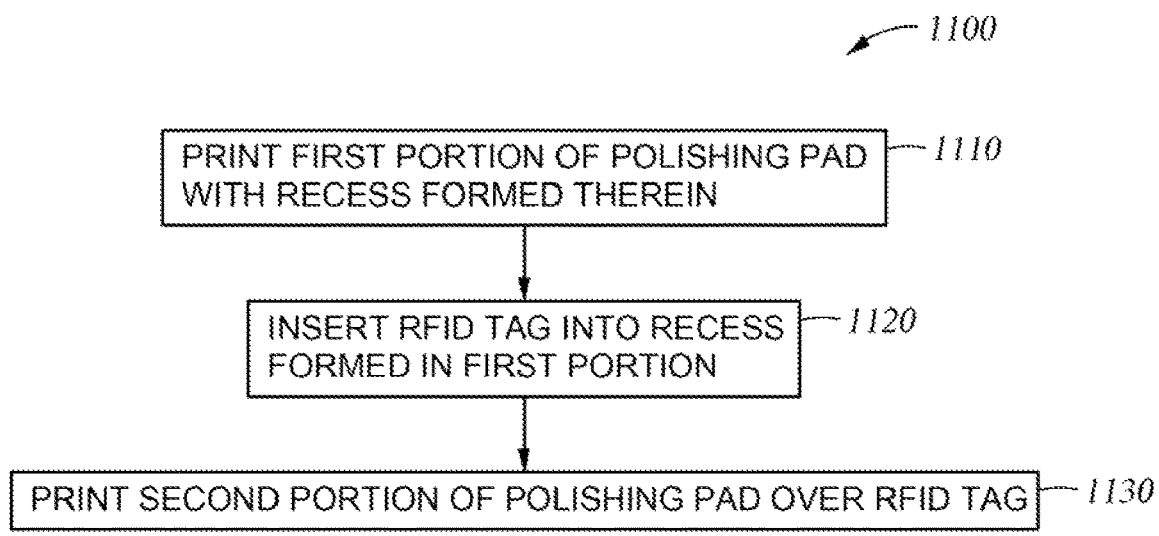
FIG. 11 illustrates a method of manufacturing a polishing pad with an RFID tag according to one embodiment described herein.

FIG. 11 illustrates a method 1100 of manufacturing a polishing pad incorporating wireless communication apparatus 600, such as an RFID tag, according to one embodiment described herein. At operation 1110, a first portion of a polishing pad may be printed with a recess or void formed therein. The recess may be a region of the first portion where substantially no pad material exists. The recess may be sized with suitable dimensions to accommodate a pre-manufactured RFID tag.

At operation 1120, a preformed RFID tag may be inserted into the recess formed in the first portion. The RFID tag may be formed on a tag substrate or it may be press fit, glued, adhered, or otherwise mechanically coupled to the first portion within the recess. At operation 1130, a second portion of the polishing pad may be printed over and around the RFID tag. Accordingly, the pre-manufactured RFID tag may be encapsulated and disposed within the first and second portions of the pad.

In the embodiments described with regard to FIG. 10 and FIG. 11, the tag printing process and recess formation process may take into consideration the compressibility of the ultimately formed pad. As the RFID tag is generally formed from materials that may have mechanical properties and dynamic properties different from the materials of the first and second pad portions, it is contemplated that various microstructural elements may be incorporated into the RFID tag or portions of the pad to provide a pad having more uniform mechanical properties and dynamic properties across the pad. It is also contemplated that various other components, such as wiring, may be integrally manufactured into the polishing pad. In some embodiments, the composition and/or properties of the layers of added material that are disposed under and/or over the RFID tag are adjusted to provide uniform mechanical properties and dynamic properties across the pad. In other words, the presence of the RFID tag within localized regions of the polishing pad can be compensated for by adjusting the material properties of materials under, over or adjacent to the RFID tag by adjusting the materials and/or material structures deposited using the additive manufacturing processes described herein. Thus, pads, membranes, retaining rings and other structures that are formed by use of an additive manufacturing process, and have one or more RFID tags disposed therein, can have more uniform mechanical and dynamic properties even though the one or more RFID tags are disposed within the formed device.

Figure 12:
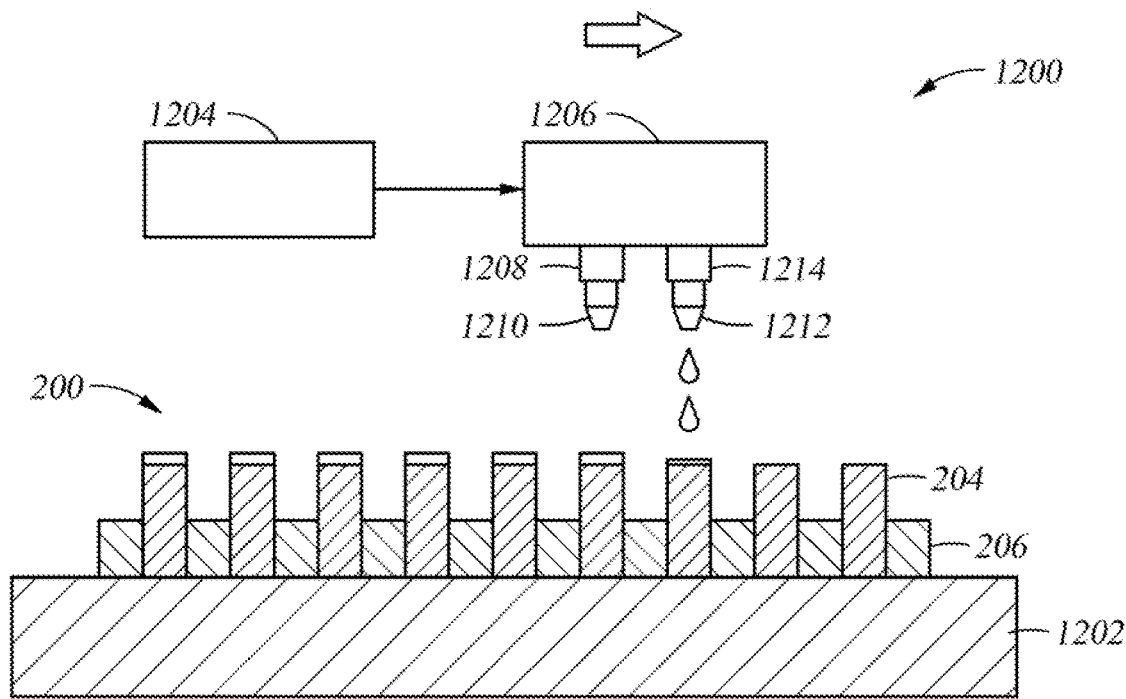
FIG. 12 is a schematic, sectional view of an apparatus for manufacturing polishing pads according to embodiments described herein.

FIG. 12 is a schematic, sectional view of a 3D printing apparatus 1200 for manufacturing polishing pads and other CMP apparatus according to embodiments described herein. Although specific examples described below are made with reference to a polishing pad, such as polishing pads 200, 300, 400, and 500, it is contemplated that other CMP apparatus, such as retaining rings (i.e. retaining ring 120) and flexible membranes (i.e. flexible membrane 132) may also be manufactured by 3D printing processes. In one embodiment, the polishing pad 200 may be printed on a support 1202. The polishing pad 200 is formed by a droplet ejecting printer 1206 from a CAD (computer-aided design) program. The droplet ejecting printer 1206 and the support 1202 may move relative to each other during the printing process.

The droplet ejecting printer 1206 generally includes one or more print heads having nozzles for dispensing precursors. The precursors may be provided in various morphologies, such as liquid or powder forms. In the illustrated embodiment, the droplet ejecting printer 1206 includes a first print head 1208 having a first nozzle 1210 and a second print head 1214 having a second nozzle 1212. The first nozzle 1210 may be configured to dispense a liquid precursor for a first material, such as a soft or elastic material, while the second nozzle 1212 may be used to dispense a liquid precursor for a second material, such as a hard material. In another embodiment, the heads 1208, 1214 and nozzles 1210, 1212 may be configured to heat a polymeric precursor to flow the precursor in a flowable or liquid-like state to enable formation of a desired apparatus.

In other embodiments, the droplet ejecting printer 1206 may include more than two print heads to form polishing pads with more than two materials. For example, in embodiments related to printing an RFID tag, such as the wireless communication apparatus 600, the first nozzle 1210 may be configured to dispense a polymeric precursor of a conductive or semi-conductive material to print electrically conductive components of the tag. The second nozzle 1212 may be configured to dispense a polymeric precursor of a non-conductive material for non-electrically conductive tag components. The precursors may be dispensed at selected locations or regions to form the polishing pad 200. These selected locations collectively form the target printing pattern and can be stored as a CAD-compatible file that is then read by an electronic controller 1204 (e.g., a computer) that controls the droplet ejecting printer 1206.

3D printing processes as described herein include, but are not limited to, polyjet deposition, inkjet printing, fused deposition modeling, binder jetting, powder bed fusion, selective laser sintering, stereolithography, vat photopolymerization digital light processing, sheet lamination, and directed energy deposition, among other 3D deposition or printing processes.

After 3D printing, the polishing pads may be solidified by curing. Curing may be performed by heating the printed polishing pads to a curing temperature. Alternatively, curing may be performed by exposing the printed polishing pad to a ultraviolet light generated by an ultra violet light source.

3D printing offers a convenient and highly controllable process for producing polishing pads formed from different materials and/or different compositions of materials. For example, 3D printing enables efficient and cost-effective incorporation of NFC apparatus, such as RFID tags, into polishing pads.

For example, the polishing pad 200 may be formed from a mixture of two or more materials. In this embodiment, the pad and pad features may be formed from one or more first materials and wireless communication apparatus 600 integrally disposed within the pad may be formed from one or more second materials. In one embodiment, the one or more first materials are predominantly not electrically conductive while the one or more second materials are predominantly electrically conductive or semi-conductive. In this embodiment, the pad 200 and polishing features 204, 206 may be formed with a mixture of first material droplets expressed from the first nozzle 1210 via the first print head 1208. The wireless communication apparatus (not shown here but illustrated in greater detail in FIG. 6) may be formed with a mixture of second material droplets expressed from the second nozzle 1212 via the second print head 1214. The print head 1210 may first align with pixels corresponding to the polishing features 204, 206 and dispense droplets on predetermined pixels. The print head 1212 may then align with the pixels corresponding to the wireless communication apparatus and dispense droplets on predetermined pixels. As a result, polishing features 204, 206 and wireless communication apparatus may be formed in a sequential process. It is also contemplated that polishing features 204, 206 and wireless communication apparatus 600 may be formed simultaneously, depending on the design of the 3D printing apparatus 1200.

Properties of the polishing features 204, 206 may be adjusted or tuned according to the ratio and/or distribution of the one or more first materials. The wireless communication apparatus 600 may be formed according to the ratio and/or distribution of the one or more second materials. In one embodiment, the composition of the polishing features 204, 206 is controlled by selecting size, location, speed, and/or density of the droplets expressed from the first nozzle 1210. Similarly, the composition of the wireless communication apparatus is controlled by selecting the size, location, speed, and/or density of the droplets expressed from the second nozzle 1212. Accordingly, it is contemplated that embodiments of the present disclosure encompass forming a polishing pad with a plurality of materials and that the material may be utilized to manufacture a polishing pad having wireless communication apparatus disposed therein.

Additive Manufacturing Process Example

In one embodiment, 3D printing may be utilized to manufacture polishing pads, retaining rings, flexible membranes, and other CMP polishing apparatus components described herein. In one embodiment, the method of forming a 3D object may be performed by use of a CAD model of the components and use of a slicing algorithm that is used to map information about the components for every layer of the 3D object. A layer of the object may be formed by distributing a powder over the surface of a powder bed. A chosen binder material may then be deposited so as to selectively join particles where regions of the object are to be formed. An actuator (e.g., piston), which supports the powder bed and the components being manufactured, may be lowered in order for the next powder layer to be formed. After each layer is formed, the process is repeated followed by a final curing process (e.g., UV exposure or thermal treatment) to finalize a portion of the object. Because 3D printing can exercise local control over the material composition, microstructure, and surface texture, various (and previously inaccessible) geometries may be achieved with the methods described herein.

In one embodiment, a polishing pad as described herein may be represented in a data structure readable by a computer rendering device or a computer display device. FIG. 12 illustrates a schematic representation of a computer system (i.e. electronic controller 1204) with a computer readable medium according to one embodiment. The computer readable medium may contain a data structure that represents the polishing pad. The data structure may be a computer file and may contain information about the structures, materials, textures, physical properties, or other characteristics of the one or more components. The data structure may also contain code, such as computer executable code or device control code that engages selected functionality of a computer rendering device or a computer display device. The data structure may be stored on the computer readable medium. The computer readable medium may include a physical storage medium such as a magnetic memory or any convenient physical storage medium. The physical storage medium may be readable by the computer system to render the component represented by the data structure on a computer screen or a physical rendering device which may be an additive manufacturing device, such as a 3D printer.

While the foregoing is directed to embodiments of the present disclosure, other and further embodiments of the disclosure may be devised without departing from the basic scope thereof, and the scope thereof is determined by the claims that follow.

What is claimed is:

1. A polishing pad apparatus, comprising:
a printed polymeric body comprising:
    a plurality of polishing features comprising a first material and defining a polishing surface configured to contact a substrate, wherein the plurality of polishing features are arranged in concentric rings; and
    one or more base features comprising a second material different than the first material, wherein the one or more base features are disposed a distance from the polishing surface of the plurality of polishing features, and the one or more base features and the plurality of polishing features are disposed in an alternating arrangement along a direction parallel to the polishing surface;
a radio frequency identification (RFID) tag integrally disposed within the printed polymeric body, wherein the RFID tag is positioned a distance from the polishing surface; and
a sensor integrally disposed within the printed polymeric body and communicatively coupled to the RFID tag.

2. The apparatus of claim 1, wherein the first and second materials are selected from the group consisting of epoxies, phenolics, amines, polyesters, urethanes, silicon, acrylates, mixtures, copolymers, and grafts thereof.

3. The apparatus of claim 1, wherein the RFID tag has an inductive antenna configured to communicate with an interrogator using a wireless communication technique.

4. The apparatus of claim 1, wherein the distance is between about 200 µm to about 500 µm from the polishing surface.

5. The apparatus of claim 1,
wherein the sensor is selected from the group consisting of a thermal sensor, an acoustic sensor, a conductivity sensor, an acceleration sensor, a torque sensor, a friction sensor, and a pressure sensor, and the RFID tag is configured to communicate with an interrogator using a wireless communication technique.

6. A chemical mechanical polishing system, comprising:
a platen having a supporting surface;
a printed polishing pad having a radio frequency identification (RFID) tag disposed therein, wherein the RFID tag stores a plurality of information associated with properties of the printed polishing pad, the printed polishing pad being disposed over the supporting surface of the platen and comprising:
    a plurality of polishing features comprising a first material and defining a polishing surface configured to contact a substrate, wherein the plurality of polishing features are arranged in concentric rings; and
    one or more base features comprising a second material different than the first material, wherein the one or more base features are disposed a distance from the polishing surface, the plurality of polishing features having a first height, the one or more base features having a second height, wherein the first height is greater than the second height, and wherein the one or more base features and the plurality of polishing features are disposed in an alternating arrangement along a direction parallel to the polishing surface;
an interrogator coupled to the platen, wherein the interrogator and the RFID tag are configured to communicate with one another using a wireless communication technique; and
a polishing head positioned opposite the platen, wherein the polishing head is configured to urge a substrate against the polishing surface of the printed polishing pad.

7. The polishing system of claim 6, wherein the printed polishing pad is formed from an electrically non-conductive polymer material and the RFID tag is formed from an electrically conductive polymer material.

8. The polishing system of claim 6, wherein the RFID tag comprises one or more of a thermal sensor, an acoustic sensor, a conductivity sensor, an acceleration sensor, a torque sensor, a friction sensor, or a pressure sensor.

9. The polishing system of claim 6, further comprising:
a retaining ring that includes an RFID tag disposed therein.

10. The polishing system of claim 6, further comprising:
a flexible membrane that includes an RFID tag disposed therein.

11. The polishing system of claim 6, wherein the interrogator is communicatively coupled to a controller that is adapted to monitor one or more processing parameters during a polishing process.

12. A method of polishing a substrate, comprising:
sensing one or more processing parameters with a radio frequency identification (RFID) tag disposed within a printed polishing pad, the RFID tag being communicatively coupled to a sensor disposed within the printed polishing pad, the printed polishing pad comprising:
    a plurality of polishing features comprising a first material and defining a polishing surface configured to contact a substrate, wherein the plurality of polishing features are arranged in concentric rings; and
    one or more base features comprising a second material different than the first material, wherein the one or more base features are disposed a distance from the polishing surface and the one or more base features and the one or more polishing features are disposed in an alternating arrangement along a direction parallel to the polishing surface;

receiving, via an interrogator, one or more signals from the RFID tag; and communicating the one or more signals to a controller adapted to control the polishing process, wherein the controller initiates a change in the polishing process in response to receiving the one or more signals.

13. The method of claim 12, wherein the one or more signals contain information generated by the sensor, wherein the sensor comprises one or more of a thermal sensor, an acoustic sensor, a conductivity sensor, an acceleration sensor, a torque sensor, a friction sensor, or a pressure sensor.

14. A non-transitory computer-readable medium storing instructions that, when executed by a processor, cause a computer system to implement a substrate polishing process, by performing the operations of:

causing initiation of a substrate polishing process;

receiving signals corresponding to one or more processing parameters, wherein the signals are generated by a wireless communication apparatus disposed within a printed polishing pad, the wireless communication apparatus comprising a radio frequency identification (RFID) tag and a sensor communicatively coupled to the RFID tag, the printed polishing pad comprising:

a plurality of polishing features comprising a first material and defining a polishing surface configured to contact a substrate, wherein the plurality of polishing features are arranged in concentric ring; and one or more base features comprising a second material different than the first material, wherein the one or more base features are disposed a distance from the polishing surface, and the one or more base features and the plurality of polishing features are disposed in an alternating arrangement along a direction parallel to the polishing surface;

analyzing the signals to determine processing conditions; and changing at least one of the one or more processing parameters in response to the processing conditions.

15. The non-transitory computer-readable medium of claim 14, wherein the processing parameters corresponding to the signals comprise one or more of a thermal signal, an acoustic signal, a conductivity signal, an acceleration signal, a torque signal, a friction signal, or a pressure signal.

16. The non-transitory computer-readable medium of claim 14, wherein the changing at least one of the one or more processing parameters is performed during the substrate polishing process.

17. The apparatus of claim 1, wherein a recess is formed in the printed polymeric body, and the RFID tag is coupled to a surface of the recess formed within the printed polymeric body.

18. The apparatus of claim 17, wherein the RFID tag comprises an electrically conductive polymer material comprising conductive nano-particles.

19. The polishing system of claim 6, wherein a recess is formed in the printed polishing pad, and the RFID tag is coupled to a surface of the recess formed within the printed polishing pad.

20. A polishing pad apparatus, comprising:
a printed polymeric body comprising:
a plurality of polishing features, which have a polishing surface configured to contact a substrate, wherein the plurality of polishing features are arranged in concentric rings; and
one or more base features, wherein the plurality of polishing features comprise a first material and the one or more base features comprise a second material different from the first material;
an RFID tag integrally disposed within the printed polymeric body, wherein the RFID tag is positioned a distance from the polishing surface and comprises an electrically conductive polymer material; and
a sensor communicatively coupled to the RFID tag, the sensor being disposed within the printed polymeric body.

21. A polishing pad apparatus, comprising:
a printed polymeric body comprising:
a plurality of polishing features comprising a first material and defining a polishing surface configured to contact a substrate, wherein the plurality of polishing features are arranged in concentric rings; and
one or more base features comprising a second material different than the first material, wherein the one or more base features are disposed a distance from the polishing surface of the one or more polishing features, and the one or more base features and the plurality of polishing features are disposed in an alternating arrangement along a direction parallel to the polishing surface; and
an RFID tag integrally disposed within the printed polymeric body, wherein the RFID tag stores a plurality of information associated with two or more properties of the printed polymeric body, wherein the RFID tag is positioned a distance from the polishing surface.

22. The apparatus of claim 21, wherein the properties of the printed polymeric body comprise: a type of the printed polymeric body, a configuration of the printed polymeric body, a surface structure of the printed polymeric body, a material of the printed polymeric body, a plurality of physical properties of the printed polymeric body, or a texture of the printed polymeric body.

23. The apparatus of claim 21, wherein the first material and the second material each comprise an acrylate.

24. The apparatus of claim 1, wherein the one or more polishing features are formed on the one or more base features, the one or more polishing features having a first height, the one or more base features having a second height, wherein the first height is greater than the second height.

25. The method of claim 12, wherein the one or more polishing features are formed on the one or more base features, the one or more polishing features having a first height, the one or more base features having a second height, wherein the first height is greater than the second height.

26. The non-transitory computer-readable medium of claim 14, wherein the one or more polishing features are formed on the one or more base features, the one or more polishing features having a first height, the one or more base features having a second height, wherein the first height is greater than the second height.

27. A polishing pad apparatus, comprising:
a printed polymeric body comprising:
a plurality of polishing features comprising a first material and defining a polishing surface configured to contact a substrate, wherein the plurality of polishing features are arranged in concentric rings; and
one or more base features comprising a second material different than the first material, wherein:
    the one or more base features are disposed a distance from the polishing surface of the plurality of polishing features;
    the plurality of polishing features have a first height and the one or more base features have a second height, wherein the first height is greater than the second height; and
    the one or more base features and the plurality of polishing features are disposed in an alternating arrangement along a direction parallel to the polishing surface; and
a radio frequency (RFID) tag integrally disposed within the printed polymeric body, wherein the RFID tag is positioned a distance from the polishing surface.

\* \* \* \* \*